US011584646B2

(12) United States Patent
Smith et al.

(10) Patent No.: US 11,584,646 B2
(45) Date of Patent: Feb. 21, 2023

(54) HOMOGENEOUS ANAEROBICALLY STABLE QUANTUM DOT CONCENTRATES

(71) Applicant: Nanosys, Inc., Milpitas, CA (US)

(72) Inventors: Austin Smith, Redwood City, CA (US); David Olmeijer, San Francisco, CA (US); Jared Lynch, Berkeley, CA (US); Minghu Tu, Milpitas, CA (US); Charles Hotz, San Rafael, CA (US)

(73) Assignee: Nanosys, Inc., Milpitas, CA (US)

( * ) Notice: Subject to any disclaimer, the term of this patent is extended or adjusted under 35 U.S.C. 154(b) by 52 days.

(21) Appl. No.: 17/146,791

(22) Filed: Jan. 12, 2021

(65) Prior Publication Data

US 2021/0130170 A1 May 6, 2021

Related U.S. Application Data

(62) Division of application No. 16/015,582, filed on Jun. 22, 2018, now Pat. No. 10,919,770.

(Continued)

(51) Int. Cl.
*C01B 25/08* (2006.01)
*G02F 1/015* (2006.01)
(Continued)

(52) U.S. Cl.
CPC ............ *C01B 25/087* (2013.01); *C01B 19/04* (2013.01); *C08F 2/38* (2013.01); *C08F 2/50* (2013.01); *C08K 5/3432* (2013.01); *C08L 63/00* (2013.01); *C08L 75/04* (2013.01); *C08L 81/02* (2013.01); *C09D 5/00* (2013.01); *C09D 7/20* (2018.01); *C09D 7/61* (2018.01); *C09D 7/67* (2018.01);
(Continued)

(58) Field of Classification Search
CPC .................................................... C01B 25/087
See application file for complete search history.

(56) References Cited

U.S. PATENT DOCUMENTS 5,505,928 A 4/1996 Alivisatos et al.
6,207,229 B1 3/2001 Bawendi et al.
(Continued)

FOREIGN PATENT DOCUMENTS

JP 2016525234 A 8/2016
WO WO 2008/027979 A2 3/2008
(Continued)

OTHER PUBLICATIONS

Battaglia, D. and Peng, X., "Formation of High Quality InP and InAs Nanocrystals in a Noncoordinating Solvent," *Nano Letters* *2(9)*:1027-1030, American Chemical Society, United States (2002).
(Continued)

*Primary Examiner* — William D Young
(74) *Attorney, Agent, or Firm* — Sterne, Kessler, Goldstein & Fox, P.L.L.C.

(57) ABSTRACT

The present disclosure provides nanostructure compositions and methods of producing nanostructure compositions. The nanostructure compositions comprise at least one population of nanostructures, at least one reactive diluent, at least one anaerobic stabilizer, and optionally at least one organic resin. The present disclosure also provides nanostructure films comprising a nanostructure layer and methods of making nanostructure films.

13 Claims, 1 Drawing Sheet

Related U.S. Application Data

(60) Provisional application No. 62/524,058, filed on Jun. 23, 2017.

(51) Int. Cl.

| | |
|---|---|
| ***H01L 33/06*** | (2010.01) |
| ***H01L 51/50*** | (2006.01) |
| ***C08L 63/00*** | (2006.01) |
| ***C08L 81/02*** | (2006.01) |
| ***C08L 75/04*** | (2006.01) |
| ***C08K 5/3432*** | (2006.01) |
| ***C01B 19/04*** | (2006.01) |
| ***C09D 7/20*** | (2018.01) |
| ***C09K 11/02*** | (2006.01) |
| ***C09D 7/61*** | (2018.01) |
| ***C08F 2/38*** | (2006.01) |
| ***C09D 5/00*** | (2006.01) |
| ***C09D 7/40*** | (2018.01) |
| ***C08F 2/50*** | (2006.01) |
| *B82Y 20/00* | (2011.01) |
| *B82Y 40/00* | (2011.01) |
| *B82Y 10/00* | (2011.01) |
| *C08K 3/30* | (2006.01) |
| *C08K 3/32* | (2006.01) |
| *C08K 9/00* | (2006.01) |
| *G02F 1/017* | (2006.01) |

(52) U.S. Cl.

CPC ............ *C09K 11/02* (2013.01); *C09K 11/025* (2013.01); *G02F 1/015* (2013.01); *H01L 33/06* (2013.01); *H01L 51/502* (2013.01); *B82Y 10/00* (2013.01); *B82Y 20/00* (2013.01); *B82Y 40/00* (2013.01); *C01P 2004/45* (2013.01); *C01P 2004/64* (2013.01); *C01P 2006/90* (2013.01); *C08F 2438/02* (2013.01); *C08K 3/30* (2013.01); *C08K 3/32* (2013.01); *C08K 9/00* (2013.01); *C08K 2201/001* (2013.01); *C08K 2201/011* (2013.01); *G02F 1/01791* (2021.01)

(56) References Cited

U.S. PATENT DOCUMENTS

| | | | |
|---|---|---|---|
| 6,225,198 | B1 | 5/2001 | Alivisatos et al. |
| 6,306,736 | B1 | 10/2001 | Alivisatos et al. |
| 6,322,901 | B1 | 11/2001 | Bawendi et al. |
| 6,509,428 | B1 | 1/2003 | Senninger et al. |
| 6,576,291 | B2 | 6/2003 | Bawendi et al. |
| 6,607,829 | B1 | 8/2003 | Bawendi et al. |
| 6,788,453 | B2 | 9/2004 | Banin et al. |
| 6,821,337 | B2 | 11/2004 | Bawendi et al. |
| 6,861,155 | B2 | 3/2005 | Bawendi et al. |
| 6,949,206 | B2 | 9/2005 | Whiteford et al. |
| 7,060,243 | B2 | 6/2006 | Bawendi et al. |
| 7,125,605 | B2 | 10/2006 | Bawendi et al. |
| 7,138,098 | B2 | 11/2006 | Bawendi et al. |
| 7,267,875 | B2 | 9/2007 | Whiteford et al. |
| 7,374,807 | B2 | 5/2008 | Parce et al. |
| 7,374,824 | B2 | 5/2008 | Bawendi et al. |
| 7,557,028 | B1 | 7/2009 | Scher et al. |
| 7,566,476 | B2 | 7/2009 | Bawendi et al. |
| 7,572,393 | B2 | 8/2009 | Whiteford et al. |
| 7,645,397 | B2 | 1/2010 | Parce et al. |
| 8,062,967 | B1 | 11/2011 | Scher et al. |
| 8,101,234 | B2 | 1/2012 | Bawendi et al. |
| 8,158,193 | B2 | 4/2012 | Bawendi et al. |
| 8,282,412 | B1 | 10/2012 | Yaguchi et al. |
| 8,563,133 | B2 | 10/2013 | Whiteford et al. |
| 9,169,435 | B2 | 10/2015 | Guo et al. |
| 10,919,770 | B2 | 2/2021 | Smith et al. |
| 2005/0129859 | A1* | 6/2005 | Misev .................... B05D 3/147 427/535 |
| 2008/0237540 | A1 | 10/2008 | Dubrow |
| 2008/0281010 | A1 | 11/2008 | Lefas et al. |
| 2009/0246643 | A1 | 10/2009 | Tomita et al. |
| 2010/0110728 | A1 | 5/2010 | Dubrow et al. |
| 2011/0262752 | A1 | 10/2011 | Bawendi et al. |
| 2011/0263062 | A1 | 10/2011 | Bawendi et al. |
| 2012/0262664 | A1 | 10/2012 | Kues et al. |
| 2014/0139786 | A1 | 5/2014 | Engel et al. |
| 2015/0236195 | A1 | 8/2015 | Guo et al. |
| 2016/0005932 | A1 | 1/2016 | Lee et al. |
| 2018/0230377 | A1* | 8/2018 | Chen ........................ C09D 5/24 |

FOREIGN PATENT DOCUMENTS

| | | | |
|---|---|---|---|
| WO | WO 2009/152404 | A1 | 12/2009 |
| WO | WO 2013/028401 | A1 | 2/2013 |
| WO | WO-2015013225 | A1 | 1/2015 |
| WO | WO-2016081219 | A1 | 5/2016 |
| WO | WO-2016168048 | A1 | 10/2016 |

OTHER PUBLICATIONS

Borchert, H., et al., "Investigation of ZnS Passivated InP Nanocrystals by XPS," *Nano Letters 2(2)*:151-154, American Chemical Society, United States (2002).

Cros-Gagneux, A., et al., "Surface Chemistry of InP Quantum Dots: A Comprehensive Study," *J. Am. Chem. Soc. 132*:18147-18157, American Chemical Society, United States (2010).

Guzelian, A.A., et al, "Colloidal chemical synthesis and characterization of InAs nanocrystal quantum dots," *Appl. Phys. Lett. 69(10)*:1432-1434, American Institute of Physics, United States (1996).

Guzelian, A.A., et al, "Synthesis of Size-Selected, Surface-Passivated InP Nanocrystals," *J. Phys. Chem. 100*:7212-7219, American Chemical Society, United States (1996).

Haubold, S., et al., "Strongly Luminescent InP/ZnS Core-Shell Nanoparticles," *ChemPhysChem 5*:331-334, Wiley-VCH-Verlag GmbH, Germany (2001).

Hussain, S., et al, "One-Pot Fabrication of High-Quality InP/ZnS (Core/Shell) Quantum Dots and Their Application to Cellular Imaging," *ChemPhysChem 10*:1466-1470, Wiley-VCH Verlag GmbH, Germany (2009).

Kim, S., et al., "Highly Luminescent InP/GaP/ZnS Nanocrystals and Their Application to White Light-Emitting Diodes," *J. Am. Chem. Soc. 134*:3804-3809, American Chemical Society, United States (2012).

Li, L., et al. "Economic Synthesis of High Quality InP Nanocrystals Using Calcium Phosphide as the Phosphorus Precursor," *Chem. Mater. 20*:2621-2623, American Chemical Society, United States (2008).

Li, L. and Reiss, P., "One-pot Synthesis of Highly Luminescent InP/ZnS Nanocrystals without Precursor Injection," *J. Am. Chem. Soc. 130*:11588-11589, American Chemical Society, United States (2008).

Lim, J., et al., "InP@ZnSeS, Core@Composition Gradient Shell Quantum Dots with Enhanced Stability," *Chemistry of Materials 23*:4459-4463, American Chemical Society, United States (2011).

Liu, Z., et al., "Coreduction Colloidal Synthesis of III-V Nanocrystals: The Case of InP," *Angew. Chem. Int. Ed. 47*:3540-3542, Wiley-VCH Verlag GmbH & Co, Germany (2008).

Lucey, D.W., et al., "Monodispersed InP Quantum Dots Prepared by Colloidal Chemistry in a Noncoordinating Solvent," *Chem. Mater. 17*:3754-3762, American Chemical Society, United States (2005).

Mićić, O. I., et al., "Synthesis and Characterization of InP, GaP, and $GaInP_2$ Quantum Dots," *J. Phys. Chem. 99*:7754-7759, American Chemical Society, United States (1995).

Mićić, O. I., et al., "Size-Dependent Spectroscopy of InP Quantum Dots," *J. Phys. Chem. B 101*:4904-4912, American Chemical Society, United States (1997).

Mićić, O. I., et al., "Core-Shell Quantum Dots of Lattice-Matched $ZnCdSe_2$ Shells on InP Cores: Experiment and Theory," *J. Phys. Chem. B 104*:12149-12156, American Chemical Society, United States (2000).

(56) References Cited

OTHER PUBLICATIONS

Nann, T., et al., "Water Splitting by Visible Light: A Nanophotocathode for Hydrogen Production," *Angew. Chem. Int. Ed. 49*:1574-1577, Wiley-VCH Verlag GmbH & Co., Germany (2010).
Wells, R.L., et al., "Use of Tris(trimethylsilyl)arsine To Prepare Gallium Arsenide and Indium Arsenide," *Chemistry of Materials 1(1)*:4-6, American Chemical Society, United States (1989).
Xie, R., et al., "Colloidal InP Nanocrystals as Efficient Emitters Covering Blue to Near-Infrared," *J. Am. Chem. Soc. 129*:15432-15433, American Chemical Society, United States (2007).
Xu, S., et al., "Rapid Synthesis of High-Quality InP Nanocrystals," *J. Am. Chem. Soc. 128*:1054-1055, American Chemical Society, United States (2006).
Zan, F., et al., "Experimental Studies on Blinking Behavior of Single InP/ZnS Quantum Dots: Effects of Synthetic Conditions and UV Irradiation," *J. Phys. Chem. C 116*:3944-3950, American Chemical Society, United States (2012).
Ziegler, J., et al., "Silica-Coated InP/ZnS Nanocrystals as Converter Material in White LEDs," *Adv. Mater 20*:4068-4073, Wiley-VCH Verlag GmbH & Co., Germany (2008).
International Search Report and Written Opinion for International Application No. PCT/US2018/038934, European Patent Office, Netherlands, dated Sep. 26, 2018, 10 pages.

* cited by examiner

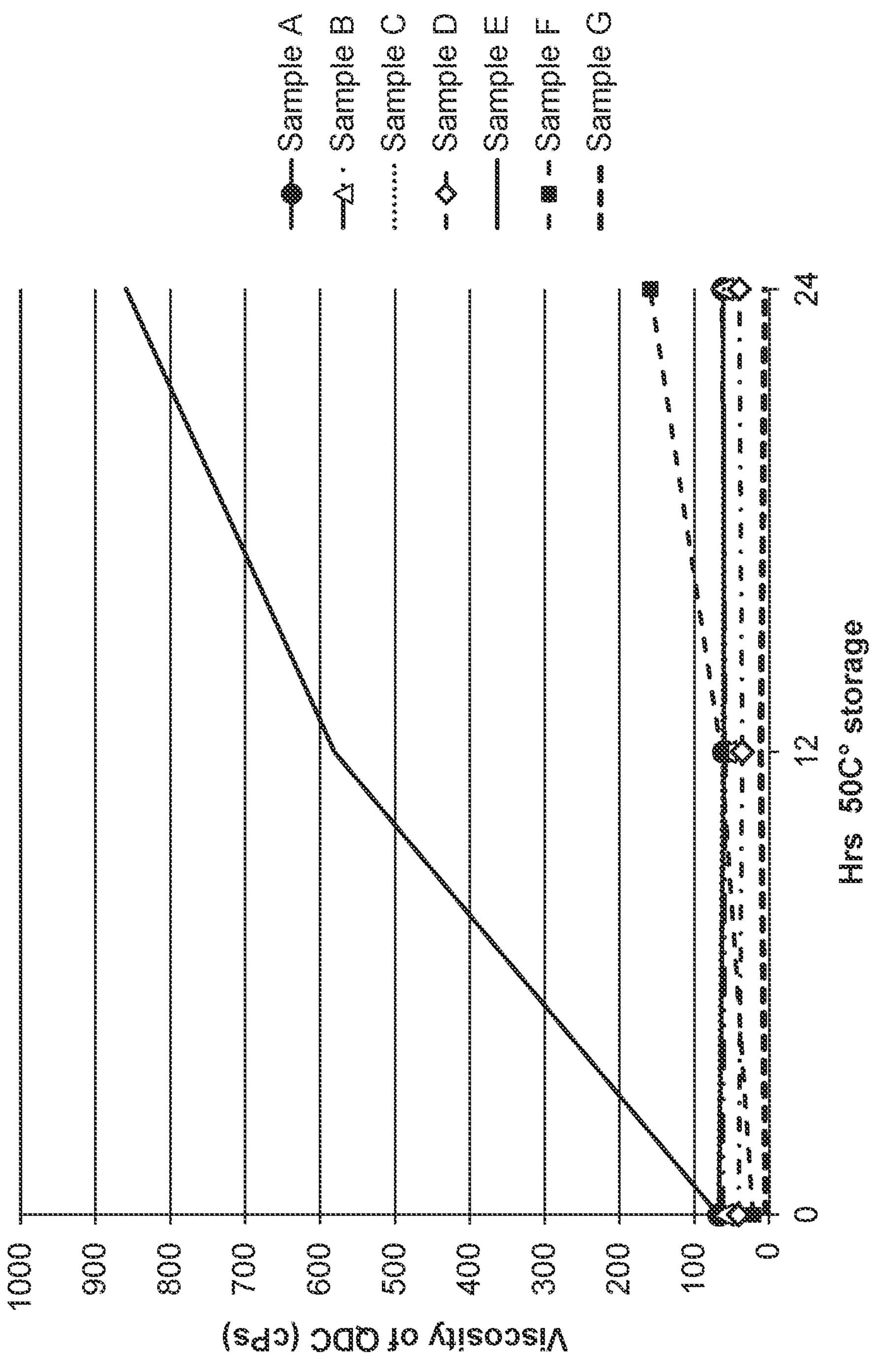
Viscosity of QDC (cPs)
1000
900
800
700
600
500
400
300
200
100
0
0
12
24
Hrs 50C° storage
Sample A
Sample B
Sample C
Sample D
Sample E
Sample F
Sample G

HOMOGENEOUS ANAEROBICALLY STABLE QUANTUM DOT CONCENTRATES

BACKGROUND OF THE INVENTION

Field of the Invention

The present disclosure provides nanostructure compositions and methods of producing nanostructure compositions. The nanostructure compositions comprise at least one population of nanostructures, at least one reactive diluent, at least one anaerobic stabilizer, and optionally at least one organic resin. The present disclosure also provides nanostructure films comprising a nanostructure layer and methods of making nanostructure films.

Background of the Invention

Quantum dots are often processed into nanocomposites, such as quantum dot enhancement film (QDEF) or other printed-ink applications through formulations of quantum dot concentrates with various curable resins.

Often, when quantum dots are manufactured for commercial purposes they are delivered as a colloidal suspension in an organic solvent such as toluene. However, delivering quantum dots in a solvent to end-users who wish to further process the quantum dots may be problematic for several reasons. First, quantum dots often require the presence of ligands on the quantum dot surfaces for maintaining the optical properties and structural integrity of the quantum dots. However, the ligands present on the quantum dot surfaces can diffuse in a solvent and, as such, the properties of quantum dots may change over time if stored in this way, whether the storage is at a manufacturing facility or an end-user facility. Second, end-users may prefer not to handle the solvents typically used for storage of quantum dots, such as toluene, due to the significant fire and health hazards and the general trend toward reducing volatile organic compounds in industrial settings. Third, the presence of even trace amounts of a carrier solvent may negatively impact the curing properties of a final quantum dot composite, for example, if the final matrix material is a polymer. Fourth, quantum dots stored in solvent may have a short shelf-life since the particles typically have a higher tendency to irreversibly agglomerate and therefore change properties over time. It is to be appreciated that, conventionally, quantum dots are shipped in solution (e.g., as suspended in an organic solvent or water) or as a powder.

In order to prepare a product which can exist as a pre-mixture of the quantum dot concentrate in a curable resin, steps must be taken to stabilize the quantum dot concentrate and the resulting pre-mixture under anaerobic conditions.

A need exists to prepare quantum dot concentrates and/or resin mixes that have improved stability under anaerobic conditions and result in improved optical properties when used to prepare a quantum dot film.

BRIEF SUMMARY OF THE INVENTION

The present disclosure is directed to a nanostructure composition, comprising:

(a) at least one population of nanostructures;

(b) at least one reactive diluent; and (c) at least one anaerobic stabilizer.

In some embodiments, the nanostructure composition comprises between one and five populations of nanostructures. In some embodiments, the nanostructure composition comprises two populations of nanostructures.

In some embodiments, the at least one population of nanostructures contains a core selected from the group consisting of InP, InZnP, InGaP, CdSe, CdS, CdSSe, CdZnSe, CdZnS, ZnSe, ZnSSe, InAs, InGaAs, and InAsP.

In some embodiments, the at least one population of nanostructures contains at least one shell.

In some embodiments, the nanostructure composition comprise a ligand bound to the nanostructures.

In some embodiments, the nanostructure composition comprises as a weight percentage between 0.0001% and 5% of the at least one population of nanostructures.

In some embodiments, the nanostructure composition comprises between one and five reactive diluents. In some embodiments, the nanostructure composition comprises one reactive diluent. In some embodiments, the at least one reactive diluent is isobornyl acrylate.

In some embodiments, the nanostructure composition comprises as a weight percentage between 0.01% and 99% of the at least one reactive diluent.

In some embodiments, the nanostructure composition comprises between one and five anaerobic stabilizers. In some embodiments, the nanostructure composition comprises one anaerobic stabilizer.

In some embodiments, the at least one anaerobic stabilizer is a nitroxide-containing compound or a nitroso-containing compound. In some embodiments, the at least one anaerobic stabilizer comprises a

group. In some embodiments, the at least one anaerobic stabilizer is 4-hydroxy-2,2,6,6-tetramethyl-1-piperidinyloxy (4-hydroxy-TEMPO).

In some embodiments, the nanostructure composition comprises two populations of nanostructures, one reactive diluent, and one anaerobic stabilizer.

In some embodiments, the nanostructure composition comprises as a weight percentage between 0.1 ppm and 1000 ppm of the at least one anaerobic stabilizer in relation to the at least one reactive diluent.

In some embodiments, the at least one reactive diluent is isobornyl acrylate and the at least one anaerobic stabilizer is 4-hydroxy-TEMPO. In some embodiments, the nanostructure composition comprises as a weight percentage about 200 ppm 4-hydroxy-TEMPO in relation to isobornyl acrylate.

In some embodiments, the nanostructures are quantum dots. In some embodiments, the nanostructure composition comprises a population of nanostructures comprising a InP core and/or a population of nanostructures comprising a CdSe core.

The present disclosure is also directed a nanostructure composition, comprising:

(a) at least one population of nanostructures;

(b) at least one reactive diluent;

(c) at least one anaerobic stabilizer; and (d) at least one organic resin.

In some embodiments, the nanostructure composition comprises between one and five populations of nanostructures. In some embodiments, the nanostructure composition comprises two populations of nanostructures.

In some embodiments, the at least one the at least one population of nanostructures contains a core selected from the group consisting of InP, InZnP, InGaP, CdSe, CdS, CdSSe, CdZnSe, CdZnS, ZnSe, ZnSSe, InAs, InGaAs, and InAsP.

In some embodiments, the at least one population of nanostructures contains at least one shell.

In some embodiments, the nanostructure composition comprise a ligand bound to the nanostructures.

In some embodiments, the nanostructure composition comprises as a weight percentage between 0.0001% and 5% of the at least one population of nanostructures.

In some embodiments, the nanostructure composition comprises between one and five reactive diluents. In some embodiments, the nanostructure composition comprises one reactive diluent. In some embodiments, the at least one reactive diluent is isobornyl acrylate.

In some embodiments, the nanostructure composition comprises as a weight percentage between 0.01% and 99% of the at least one reactive diluent.

In some embodiments, the nanostructure composition comprises between one and five anaerobic stabilizers. In some embodiments, the nanostructure composition comprises one anaerobic stabilizer.

In some embodiments, the at least one anaerobic stabilizer is a nitroxide-containing compound or a nitroso-containing compound. In some embodiments, the at least one anaerobic stabilizer comprises a

group. In some embodiments, the at least one anaerobic stabilizer is 4-hydroxy-2,2,6,6-tetramethyl-1-piperidinyloxy (4-hydroxy-TEMPO).

In some embodiments, the nanostructure composition comprises two populations of nanostructures, one reactive diluent, and one anaerobic stabilizer.

In some embodiments, the nanostructure composition comprises as a weight percentage between 0.1 ppm and 1000 ppm of the at least one anaerobic stabilizer in relation to the at least one reactive diluent.

In some embodiments, the at least one reactive diluent is isobornyl acrylate and the at least one anaerobic stabilizer is 4-hydroxyl-TEMPO. In some embodiments, the nanostructure composition comprises as a weight percentage about 200 ppm 4-hydroxy-TEMPO in relation to isobornyl acrylate.

In some embodiments, the nanostructure composition comprises between one and five organic resins. In some embodiments, the nanostructure composition comprises two organic resins.

In some embodiments, the at least one organic resin is a thermosetting resin or a UV curable resin. In some embodiments, the at least one organic resin is a UV curable resin. In some embodiments, the at least one organic resin is a mercapto-functional compound.

In some embodiments, the nanostructure composition comprises at least one thermal initiator or photoinitiator.

In some embodiments, the nanostructure composition comprises as a weight percentage between 5% and 99% of the at least one organic resin.

In some embodiments, the nanostructure composition comprises two populations of nanostructures, one reactive diluent, one anaerobic stabilizer, and two organic resins.

In some embodiments, the nanostructures are quantum dots. In some embodiments, the nanostructure composition comprises a population of nanostructures comprising a InP core and/or a population of nanostructures comprising a CdSe core.

In some embodiments, the nanostructure composition is stable for between 1 day and 3 years.

In some embodiments, a molded article comprising the nanostructure composition is provided. In some embodiments, the molded article is a film, a substrate for a display, or a light emitting diode. In some embodiments, the molded article is a film.

The present disclosure is directed to a method of preparing a nanostructure composition, the method comprising:

(a) providing a composition comprising at least one population of nanostructures and at least one solvent;
(b) admixing at least one reactive diluent and at least one anaerobic stabilizer with the composition of (a); and
(c) removing the at least one solvent in the composition of (b).

In some embodiments, the admixing in (b) comprises:

(1) dissolving the at least one anaerobic stabilizer in the at least one reactive diluent; and (2) degassing the composition of (1) to remove dissolved oxygen.

In some embodiments, the dissolving in (1) is at a temperature between 10° C. and 90° C. In some embodiments, the dissolving in (1) is for a time of between 1 minute and 24 hours.

In some embodiments, the degassing in (2) is by pulling a vacuum down to between 1 mtorr and 500 mtorr. In some embodiments, the degassing in (2) is for a time of between 10 minutes and 48 hours.

In some embodiments, the admixing in (b) is at an agitation rate between 100 rpm and 10,000 rpm. In some embodiments, the admixing in (b) is for a time of between 10 minutes and 24 hours.

In some embodiments, the removing in (c) is under vacuum. In some embodiments, the removing in (c) is by pulling a vacuum down to between 1 mtorr and 1000 mtorr. In some embodiments, the removing in (c) is for a time of between 10 minutes and 48 hours.

In some embodiments, a composition comprising two populations of nanostructures is provided in (a).

In some embodiments, the at least one population of nanostructures contains a core selected from the group consisting of InP, InZnP, InGaP, CdSe, CdS, CdSSe, CdZnSe, CdZnS, ZnSe, ZnSSe, InAs, InGaAs, and InAsP.

In some embodiments, the at least one population of nanostructures further contains at least one shell.

In some embodiments, the nanostructure composition further comprises a ligand bound to the nanostructures.

In some embodiments, the nanostructure composition comprises as a weight percentage between 0.01% and 99% of the at least one population of nanostructures.

In some embodiments, the nanostructure composition comprises between one and five reactive diluents. In some embodiments, the nanostructure composition comprises one reactive diluent. In some embodiments, the at least one reactive diluent is isobornyl acrylate.

In some embodiments, the nanostructure composition comprises as a weight percentage between 0.01% and 99% of the at least one reactive diluent.

In some embodiments, the nanostructure composition comprises between one and five anaerobic stabilizers. In some embodiments, the nanostructure composition comprises one anaerobic stabilizer.

In some embodiments, the at least one anaerobic stabilizer is a nitroxide-containing compound or a nitroso-containing compound. In some embodiments, the at least one anaerobic stabilizer comprises a

group. In some embodiments, the at least one anaerobic stabilizer is 4-hydroxy-2,2,6,6-tetramethyl-1-piperidinyloxy (4-hydroxy-TEMPO).

In some embodiments, the nanostructure composition comprises two populations of nanostructures, one reactive diluent, and one anaerobic stabilizer.

In some embodiments, the nanostructure composition comprises as a weight percentage between 0.1 ppm and 1000 ppm of the at least one anaerobic stabilizer in relation to the at least one reactive diluent.

In some embodiments, the at least one reactive diluent is isobornyl acrylate and the at least one anaerobic stabilizer is 4-hydroxy-TEMPO. In some embodiments, the nanostructure composition comprises as a weight percentage about 200 ppm 4-hydroxy-TEMPO in relation to isobornyl acrylate.

In some embodiments, the nanostructures are quantum dots. In some embodiments, the quantum dots are InP and/or CdSe quantum dots.

The present disclosure is directed to a method of preparing a nanostructure composition, the method comprising:

(a) providing a composition comprising at least one population of nanostructures and at least one solvent;
(b) admixing at least one reactive diluent and at least one anaerobic stabilizer with the composition of (a);
(c) removing the at least one solvent in the composition of (b); and
(d) admixing at least one organic resin with the composition of (c).

In some embodiments, the admixing in (b) comprises:

(1) dissolving the at least one anaerobic stabilizer in the at least one reactive diluent; and (2) degassing the composition of (1) to remove dissolved oxygen.

In some embodiments, the dissolving in (1) is at a temperature between 10° C. and 90° C. In some embodiments, the dissolving in (1) is for a time of between 1 minute and 24 hours.

In some embodiments, the degasssing in (2) is by pulling a vacuum down to between 1 mtorr and 500 mtorr. In some embodiments, the degassing in (2) is for a time of between 10 minutes and 48 hours.

In some embodiments, the admixing in (b) is at an agitation rate between 100 rpm and 10,000 rpm. In some embodiments, the admixing in (b) is for a time of between 10 minutes and 24 hours.

In some embodiments, the removing in (c) is under vacuum. In some embodiments, the removing in (c) is by pulling a vacuum down to between 1 mtorr and 1000 mtorr. In some embodiments, the removing in (c) is for a time of between 10 minutes and 48 hours.

In some embodiments, a composition comprising two populations of nanostructures is provided in (a).

In some embodiments, the at least one population of nanostructures contains a core selected from the group consisting of InP, InZnP, InGaP, CdSe, CdS, CdSSe, CdZnSe, CdZnS, ZnSe, ZnSSe, InAs, InGaAs, and InAsP.

In some embodiments, the at least one population of nanostructures further contains at least one shell.

In some embodiments, the nanostructure composition further comprises a ligand bound to the nanostructures.

In some embodiments, the nanostructure composition comprises as a weight percentage between 0.01% and 99% of the at least one population of nanostructures.

In some embodiments, the nanostructure composition comprises between one and five reactive diluents. In some embodiments, the nanostructure composition comprises one reactive diluent. In some embodiments, the at least one reactive diluent is isobornyl acrylate.

In some embodiments, the nanostructure composition comprises as a weight percentage between 0.01% and 99% of the at least one reactive diluent.

In some embodiments, the nanostructure composition comprises between one and five anaerobic stabilizers. In some embodiments, the nanostructure composition comprises one anaerobic stabilizer.

In some embodiments, the at least one anaerobic stabilizer is a nitroxide-containing compound or a nitroso-containing compound. In some embodiments, the at least one anaerobic stabilizer comprises a

group. In some embodiments, the at least one anaerobic stabilizer is 4-hydroxy-2,2,6,6-tetramethyl-1-piperidinyloxy (4-hydroxy-TEMPO).

In some embodiments, the nanostructure composition comprises two populations of nanostructures, one reactive diluent, and one anaerobic stabilizer.

In some embodiments, the nanostructure composition comprises as a weight percentage between 0.1 ppm and 1000 ppm of the at least one anaerobic stabilizer in relation to the at least one reactive diluent.

In some embodiments, the at least one reactive diluent is isobornyl acrylate and the at least one anaerobic stabilizer is 4-hydroxy-TEMPO. In some embodiments, the nanostructure composition comprises as a weight percentage about 200 ppm 4-hydroxy-TEMPO in relation to isobornyl acrylate.

In some embodiments, the admixing in (d) is at an agitation rate between 100 rpm and 10,000 rpm. In some embodiments, the admixing in (d) is for a time of between 10 minutes and 24 hours.

In some embodiments, the nanostructure composition comprises between one and five organic resins. In some embodiments, the nanostructure composition comprises two organic resins.

In some embodiments, the at least one organic resin is a thermosetting resin or a UV curable resin. In some embodiments, the at least one organic resin is a UV curable resin. In some embodiments, the at least one organic resin is a mercapto-functional compound In some embodiments, the method further comprises (e) admixing at least one thermal initiator or photoinitiator with the composition of (d).

In some embodiments, the admixing in (e) is at an agitation rate between 100 rpm and 10,000 rpm. In some embodiments, the admixing in (e) is for a time of between 10 minutes and 24 hours.

In some embodiments, the nanostructure composition comprises as a weight percentage between 5% and 99% of the at least one organic resin In some embodiments, the nanostructure composition comprises two populations of nanostructures, one reactive diluent, one anaerobic stabilizer, and two organic resins.

In some embodiments, the nanostructures are quantum dots. In some embodiments, the quantum dots are InP and/or CdSe quantum dots.

The present disclosure is also directed a nanostructure film layer comprising:

(a) at least one population of nanostructures;
(b) at least one reactive diluent;
(c) at least one anaerobic stabilizer; and
(d) at least one organic resin.

In some embodiments, the nanostructure film layer comprises between one and five populations of nanostructures. In some embodiments, the nanostructure film layer comprises two populations of nanostructures.

In some embodiments, the at least one the at least one population of nanostructures contains a core selected from the group consisting of InP, InZnP, InGaP, CdSe, CdS, CdSSe, CdZnSe, CdZnS, ZnSe, ZnSSe, InAs, InGaAs, and InAsP.

In some embodiments, the at least one population of nanostructures contains at least one shell.

In some embodiments, the nanostructure film layer comprise a ligand bound to the nanostructures.

In some embodiments, the nanostructure film layer comprises as a weight percentage between 0.0001% and 5% of the at least one population of nanostructures.

In some embodiments, the nanostructure film layer comprises between one and five reactive diluents. In some embodiments, the nanostructure film layer comprises one reactive diluent. In some embodiments, the at least one reactive diluent is isobornyl acrylate.

In some embodiments, the nanostructure film layer comprises as a weight percentage between 0.01% and 99% of the at least one reactive diluent.

In some embodiments, the nanostructure film layer comprises between one and five anaerobic stabilizers. In some embodiments, the nanostructure film layer comprises one anaerobic stabilizer.

In some embodiments, the at least one anaerobic stabilizer is a nitroxide-containing compound or a nitroso-containing compound. In some embodiments, the at least one anaerobic stabilizer comprises a

group. In some embodiments, the at least one anaerobic stabilizer is 4-hydroxy-2,2,6,6-tetramethyl-1-piperidinyloxy (4-hydroxy-TEMPO).

In some embodiments, the nanostructure film layer comprises two populations of nanostructures, one reactive diluent, and one anaerobic stabilizer.

In some embodiments, the nanostructure film layer comprises as a weight percentage between 0.1 ppm and 1000 ppm of the at least one anaerobic stabilizer in relation to the at least one reactive diluent.

In some embodiments, the at least one reactive diluent is isobornyl acrylate and the at least one anaerobic stabilizer is 4-hydroxy-TEMPO. In some embodiments, the nanostructure film layer comprises as a weight percentage about 200 ppm 4-hydroxy-TEMPO in relation to isobornyl acrylate.

In some embodiments, the nanostructure film layer comprises between one and five organic resins. In some embodiments, the nanostructure film layer comprises two organic resins.

In some embodiments, the at least one organic resin is a thermosetting resin or a UV curable resin. In some embodiments, the at least one organic resin is a UV curable resin. In some embodiments, the at least one organic resin is a mercapto-functional compound.

In some embodiments, the nanostructure film layer comprises at least one thermal initiator or photoinitiator.

In some embodiments, the nanostructure film layer comprises as a weight percentage between 5% and 99% of the at least one organic resin.

In some embodiments, the nanostructure film layer comprises two populations of nanostructures, one reactive diluent, one anaerobic stabilizer, and two organic resins.

In some embodiments, the nanostructures are quantum dots. In some embodiments, the nanostructure composition comprises a population of nanostructures comprising a InP core and/or a population of nanostructures comprising a CdSe core.

BRIEF DESCRIPTION OF THE DRAWINGS

The accompanying drawings, which are incorporated herein and form a part of the specification, illustrate the present disclosure and, together with the description, further serve to explain the principles of the disclosure and to enable a person skilled in the pertinent art to make and use the disclosure.

FIG. 1 is a graph showing viscosity versus storage time for (A) a green quantum dot concentrate with 200 ppm 4-hydroxy-TEMPO; (B) a red quantum dot concentrate with 200 ppm 4-hydroxy-TEMPO; (C) a green quantum dot concentrate with 200 ppm 4-hydroxy-TEMPO; (D) a red quantum dot concentrate with 200 ppm 4-hydroxy-TEMPO; (E) a green quantum dot concentrate without 4-hydroxy-TEMPO; (F) a red quantum dot concentrate without 4-hydroxy-TEMPO; and (G) isobornyl acrylate control.

DETAILED DESCRIPTION OF THE INVENTION

Unless defined otherwise, all technical and scientific terms used herein have the same meaning as commonly understood by one of ordinary skill in the art to which the disclosure pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present disclosure, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by ±10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

The stability of a nanostructure composition can be determined by measuring the viscosity after admixing at least one population of nanostructure, at least one reactive diluent, at least one anaerobic stabilizer, and optionally at least one organic resin. Viscosity can be measured using a cone and plate Brookfield viscometer. A nanostructure composition is stable if the viscosity does not increase more than 40%.

As used herein, the term "reactive diluent" refers to one or more monomers and/or one or more oligomers that are substantially non-reactive with nanostructures under conditions used to prepare and store a nanostructure composition, but are capable of undergoing a reaction to form a polymer and/or interpenetrating network. In some embodiments, the reactive diluent is capable of undergoing a radical polymerization reaction.

As used herein, the term "non-reactive diluent" refers to one or more agents that are substantially non-reactive with nanostructures under conditions used to prepare and store a nanostructure composition, and are not reactive under reaction conditions, e.g., are not capable of undergoing a radical polymerization reaction.

As used herein, the term "anaerobic condition" refers to less than 10 ppm oxygen.

As used herein, the term "anaerobic stabilizer" refers to a compound that stabilizes a nanostructure composition by minimizing uncontrolled polymerization during storage in the absence or near absence of oxygen.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

"Alkyl" as used herein refers to a straight or branched, saturated, aliphatic radical having the number of carbon atoms indicated. In some embodiments, the alkyl is $C_{1-2}$ alkyl, $C_{1-3}$ alkyl, $C_{1-4}$ alkyl, $C_{1-5}$ alkyl, $C_{1-6}$ alkyl, $C_{1-7}$ alkyl, $C_{1-8}$ alkyl, $C_{1-9}$ alkyl, $C_{1-10}$ alkyl, $C_{1-12}$ alkyl, $C_{1-14}$ alkyl, $C_{1-16}$ alkyl, $C_{1-18}$ alkyl, $C_{1-20}$ alkyl, $C_{8-20}$ alkyl, $C_{12-20}$ alkyl, $C_{14-20}$ alkyl, $C_{16-20}$ alkyl, or $C_{18-20}$ alkyl. For example, $C_{1-6}$ alkyl includes, but is not limited to, methyl, ethyl, propyl, isopropyl, butyl, isobutyl, sec-butyl, tert-butyl, pentyl, isopentyl, and hexyl. In some embodiments, the alkyl is octyl, nonyl, decyl, undecyl, dodecyl, tridecyl, tetradecyl, pentadecyl, hexadecyl, heptadecyl, octadecyl, nonadecyl, or icosanyl.

"Alkenyl" as used herein refers to a monovalent group derived from a straight- or branched-chain hydrocarbon moiety having at least one carbon-carbon double bond by the removal of a single hydrogen atom. In some embodiments, the alkenyl group contains 2-20 carbon atoms and is a $C_{2-20}$ alkenyl. In some embodiments, the alkenyl group contains 2-15 carbon atoms and is a $C_{2-15}$ alkenyl. In some embodiments, the alkenyl group contains 2-10 carbon atoms and is a $C_{2-10}$ alkenyl. In some embodiments, the alkenyl group contains 2-8 carbon atoms and is a $C_{2-8}$ alkenyl. In some embodiments, the alkenyl group contains 2-5 carbons and is a $C_{2-5}$ alkenyl. Alkenyl groups include, for example, ethenyl, propenyl, butenyl, and 1-methyl-2-buten-1-yl.

"Alkynyl" as used herein refers to a monovalent group derived from a straight- or branched-chain hydrocarbon having at least one carbon-carbon triple bond by the removal of a single hydrogen atom. In some embodiments, the alkynyl group contains 2-20 carbon atoms and is a $C_{2-20}$ alkynyl. In some embodiments, the alkynyl group contains 2-15 carbon atoms and is a $C_{2-15}$ alkynyl. In some embodiments, the alkynyl group contains 2-10 carbon atoms and is a $C_{2-10}$ alkynyl. In some embodiments, the alkynyl group contains 2-8 carbon atoms and is a $C_{2-8}$ alkynyl. In some embodiments, the alkynyl group contains 2-5 carbons and is a $C_{2-5}$ alkynyl. Representative alkynyl groups include, but are not limited to, ethynyl, 2-propynyl (propargyl), and 1-propynyl.

"Alkylamino" as used herein, refers to a "substituted amino" of the formula ($—NR^K_2$), wherein $R^K$ is, independently, a hydrogen or an optionally substituted alkyl group, as defined herein, and the nitrogen moiety is directly attached to the parent molecule.

"Heteroalkyl" as used herein, refers to an alkyl moiety which is optionally substituted with one or more functional groups, and that contain one or more oxygen, sulfur, nitrogen, phosphorus, or silicon atoms, e.g., in place of carbon atoms.

"Cycloalkyl" as used herein, refers to a monovalent or divalent group of 3 to 8 carbon atoms, preferably 3 to 5 carbon atoms derived from a saturated cyclic hydrocarbon. Cycloalkyl groups can be monocyclic or polycyclic. Cycloalkyl can be substituted by $C_{1-3}$ alkyl groups or halogens.

"Carboxyalkyl" as used herein, refers to a carboxylic acid group (—COOH) appended to a lower alkyl radical.

"Heterocycloalkyl" as used herein, refers to cycloalkyl substituents that have from 1 to 5, and more typically from 1 to 4 heteroatoms in the ring structure. Suitable heteroatoms employed in compounds of the present disclosure are nitrogen, oxygen, and sulfur. Representative heterocycloalkyl moieties include, for example, morpholino, piperazinyl, piperidinyl, and the like.

The term "alkylene," as used herein, alone or in combination, refers to a saturated aliphatic group derived from a straight or branched chain saturated hydrocarbon attached at two or more positions, such as methylene ($—CH_2—$). Unless otherwise specified, the term "alkyl" may include "alkylene" groups.

"Aryl" as used herein refers to unsubstituted monocyclic or bicyclic aromatic ring systems having from six to fourteen carbon atoms, i.e., a $C_{6-14}$ aryl. Non-limiting exemplary aryl groups include phenyl, naphthyl, phenanthryl, anthracyl, indenyl, azulenyl, biphenyl, biphenylenyl, and fluorenyl groups. In one embodiment, the aryl group is a phenyl or naphthyl.

"Heteroaryl" or "heteroaromatic" as used herein refers to unsubstituted monocyclic and bicyclic aromatic ring systems having 5 to 14 ring atoms, i.e., a 5- to 14-membered heteroaryl, wherein at least one carbon atom of one of the rings is replaced with a heteroatom independently selected from the group consisting of oxygen, nitrogen and sulfur. In one embodiment, the heteroaryl contains 1, 2, 3, or 4 heteroatoms independently selected from the group consisting of oxygen, nitrogen and sulfur. In one embodiment, the heteroaryl has three heteroatoms. In another embodiment, the heteroaryl has two heteroatoms. In another embodiment, the heteroaryl has one heteroatom. In another embodiment, the heteroaryl is a 5- to 10-membered heteroaryl. In another embodiment, the heteroaryl is a 5- or 6-membered heteroaryl. In another embodiment, the heteroaryl has 5 ring atoms, e.g., thienyl, a 5-membered heteroaryl having four carbon atoms and one sulfur atom. In another embodiment, the heteroaryl has 6 ring atoms, e.g., pyridyl, a 6-membered heteroaryl having five carbon atoms and one nitrogen atom. Non-limiting exemplary heteroaryl groups include thienyl, benzo[b]thienyl, naphtho[2,3-b]thienyl, thianthrenyl, furyl, benzofuryl, pyranyl, isobenzofuranyl, benzooxazonyl, chromenyl, xanthenyl, 2H-pyrrolyl, pyrrolyl, imidazolyl, pyrazolyl, pyridyl, pyrazinyl, pyrimidinyl, pyridazinyl, isoindolyl, 3H-indolyl, indolyl, indazolyl, purinyl, isoquinolyl, quinolyl, phthalazinyl, naphthyridinyl, cinnolinyl, quinazolinyl, pteridinyl, 4aH-carbazolyl, carbazolyl, β-carbolinyl, phenanthridinyl, acridinyl, pyrimidinyl, phenanthrolinyl, phenazinyl, thiazolyl, isothiazolyl, phenothiazolyl, isoxazolyl, furazanyl, and phenoxazinyl. In one embodiment, the heteroaryl is thienyl (e.g., thien-2-yl and thien-3-yl), furyl (e.g., 2-furyl and 3-furyl), pyrrolyl (e.g., 1H-pyrrol-2-yl and 1H-pyrrol-3-yl), imidazolyl (e.g., 2H-imidazol-2-yl and 2H-imidazol-4-yl), pyrazolyl (e.g., 1H-pyrazol-3-yl, 1H-pyrazol-4-yl, and 1H-pyrazol-5-yl), pyridyl (e.g., pyridin-2-yl, pyridin-3-yl, and pyridin-4-yl), pyrimidinyl (e.g., pyrimidin-2-yl, pyrimidin-4-yl, and pyrimidin-5-yl), thiazolyl (e.g., thiazol-2-yl, thiazol-4-yl, and thiazol-5-yl), isothiazolyl (e.g., isothiazol-3-yl, isothiazol-4-yl, and isothiazol-5-yl), oxazolyl (e.g., oxazol-2-yl, oxazol-4-yl, and oxazol-5-yl), isoxazolyl (e.g., isoxazol-3-yl, isoxazol-4-yl, and isoxazol-5-yl), or indazolyl (e.g., 1H-indazol-3-yl). The term "heteroaryl" also includes possible N-oxides. A non-limiting exemplary N-oxide is pyridyl N-oxide.

Unless clearly indicated otherwise, ranges listed herein are inclusive.

A variety of additional terms are defined or otherwise characterized herein.

Nanostructure Composition

In some embodiments, the present disclosure provides a nanostructure composition comprising:

(a) at least one population of nanostructures;
(b) at least one reactive diluent; and
(c) at least one anaerobic stabilizer.

In some embodiments, the nanostructure composition further comprises a solvent.

In some embodiments, the nanostructure composition further comprises a ligand bound to the nanostructure.

In some embodiments, the nanostructure is a quantum dot.

In some embodiments, the present disclosure provides a nanostructure composition comprising:

(a) at least one population of nanostructures;
(b) at least one reactive diluent;
(c) at least one anaerobic stabilizer; and
(d) at least one organic resin.

In some embodiments, the nanostructure composition further comprises a solvent.

In some embodiments, the nanostructure composition further comprises a ligand bound to the nanostructure.

In some embodiments, the nanostructure is a quantum dot.

In some embodiments, the present disclosure provides a nanostructure film kit comprising:

(a) a first composition comprising at least one population of nanostructures;
(b) a second composition comprising at least one reactive diluent and at least one anaerobic stabilizer;
(c) a third composition comprising at least one organic resin; and
(d) instructions for preparing a nanostructure film.

In some embodiments, the nanostructure film kit further comprises a solvent.

In some embodiments, the nanostructure composition further comprises a ligand bound to the nanostructure.

In some embodiments, the nanostructure is a quantum dot.

Nanostructure Film Layer

In some embodiments, the present disclosure provides a nanostructure film layer comprising:

(a) at least one population of nanostructures;
(b) at least one reactive diluent;
(c) at least one anaerobic stabilizer; and
(d) at least one organic resin.

In some embodiments, the nanostructure composition further comprises a ligand bound to the nanostructure.

In some embodiments, the nanostructure is a quantum dot.

Nanostructure Molded Article

In some embodiments, the present disclosure provides a nanostructure molded article comprising:

(a) at least one population of nanostructures;
(b) at least one reactive diluent;
(c) at least one anaerobic stabilizer; and
(d) at least one organic resin.

In some embodiments, the molded article is a film, a substrate for a display, or a light emitting diode.

In some embodiments, the nanostructure composition further comprises a ligand bound to the nanostructure.

In some embodiments, the nanostructure is a quantum dot.

In some embodiments, the present disclosure provides a nanostructure film comprising:

(a) a first barrier layer;
(b) a second barrier layer; and
(c) a nanostructure layer between the first barrier layer and the second barrier layer, wherein the nanostructure layer comprises at least one population of nanostructures; at least one reactive diluent; at least one anaerobic stabilizer; and at least one organic resin.

In some embodiments, the nanostructure composition further comprises a ligand bound to the nanostructure.

In some embodiments, the nanostructure is a quantum dot.

Quantum Dots

The quantum dots (or other nanostructures) for use in the present disclosure can be produced from any suitable material, suitably an inorganic material, and more suitably an inorganic conductive or semiconductive material. Suitable semiconductor materials include any type of semiconductor, including Group II-VI, Group III-V, Group IV-VI, and Group IV semiconductors. Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof.

The synthesis of Group II-VI nanostructures has been described in U.S. Pat. Nos. 6,225,198, 6,322,901, 6,207,229, 6,607,829, 6,861,155, 7,060,243, 7,125,605, 7,374,824, 7,566,476, 8,101,234, and 8,158,193 and in U.S. Patent Appl. Publication Nos. 2011/0262752 and 2011/0263062. In some embodiments, the core is a Group II-VI nanocrystal selected from the group consisting of ZnO, ZnSe, ZnS, ZnTe, CdO, CdSe, CdS, CdTe, HgO, HgSe, HgS, and HgTe. In some embodiments, the core is a nanocrystal selected from the group consisting of ZnSe, ZnS, CdSe, or CdS.

Although Group II-VI nanostructures such as CdSe and CdS quantum dots can exhibit desirable luminescence behavior, issues such as the toxicity of cadmium limit the applications for which such nanostructures can be used. Less toxic alternatives with favorable luminescence properties are thus highly desirable. Group III-V nanostructures in general and InP-based nanostructures in particular, offer the best known substitute for cadmium-based materials due to their compatible emission range.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present disclosure is limited by the trace metal concentration in the precursor materials. The trace metal (including cadmium) concentration in the precursor materials for the Cd-free nanostructures, can be measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

In some embodiments, the core is a Group III-V nanostructure. In some embodiments, the core is a Group III-V nanocrystal selected from the group consisting of BN, BP, BAs, BSb, AlN, AlP, AlAs, AlSb, GaN, GaP, GaAs, GaSb, InN, InP, InAs, and InSb. In some embodiments, the core is a InP nanocrystal.

The synthesis of Group III-V nanostructures has been described in U.S. Pat. Nos. 5,505,928, 6,306,736, 6,576,291, 6,788,453, 6,821,337, 7,138,098, 7,557,028, 7,645,397, 8,062,967, and 8,282,412 and in U.S. Patent Appl. Publication No. 2015/236195. Synthesis of Group III-V nanostructures has also been described in Wells, R. L., et al., "The use of tris(trimethylsilyl)arsine to prepare gallium arsenide and indium arsenide," *Chem. Mater.* 1:4-6 (1989) and in Guzelian, A. A., et al., "Colloidal chemical synthesis and characterization of InAs nanocrystal quantum dots," *Appl. Phys. Lett.* 69: 1432-1434 (1996).

Synthesis of InP-based nanostructures has been described, e.g., in Xie, R., et al., "Colloidal InP nanocrystals as efficient emitters covering blue to near-infrared," *J. Am. Chem. Soc.* 129:15432-15433 (2007); Micic, O. I., et al., "Core-shell quantum dots of lattice-matched $ZnCdSe_2$ shells on InP cores: Experiment and theory," *J. Phys. Chem. B* 104:12149-12156 (2000); Liu, Z., et al., "Coreduction colloidal synthesis of III-V nanocrystals: The case of InP," *Angew. Chem. Int. Ed. Engl.* 47:3540-3542 (2008); Li, L. et al., "Economic synthesis of high quality InP nanocrystals using calcium phosphide as the phosphorus precursor," *Chem. Mater.* 20:2621-2623 (2008); D. Battaglia and X. Peng, "Formation of high quality InP and InAs nanocrystals in a noncoordinating solvent," *Nano Letters* 2:1027-1030 (2002); Kim, S., et al., "Highly luminescent InP/GaP/ZnS nanocrystals and their application to white light-emitting diodes," *J. Am. Chem. Soc.* 134:3804-3809 (2012); Nann, T., et al., "Water splitting by visible light: A nanophotocathode for hydrogen production," *Angew. Chem. Int. Ed.* 49:1574-1577 (2010); Borchert, H., et al., "Investigation of ZnS passivated InP nanocrystals by XPS," *Nano Letters* 2:151-154 (2002); L. Li and P. Reiss, "One-pot synthesis of highly luminescent InP/ZnS nanocrystals without precursor injection," *J. Am. Chem. Soc.* 130:11588-11589 (2008); Hussain, S., et al. "One-pot fabrication of high-quality InP/ZnS (core/shell) quantum dots and their application to cellular imaging," *Chemphyschem.* 10:1466-1470 (2009); Xu, S., et al., "Rapid synthesis of high-quality InP nanocrystals," *J. Am. Chem. Soc.* 128:1054-1055 (2006); Micic, O. I., et al., "Size-dependent spectroscopy of InP quantum dots," *J. Phys. Chem. B* 101:4904-4912 (1997); Haubold, S., et al., "Strongly luminescent InP/ZnS core-shell nanoparticles," *Chemphyschem.* 5:331-334 (2001); CrosGagneux, A., et al., "Surface chemistry of InP quantum dots: A comprehensive study," *J. Am. Chem. Soc.* 132:18147-18157 (2010); Micic, O. I., et al., "Synthesis and characterization of InP, GaP, and $GaInP_2$ quantum dots," *J. Phys. Chem.* 99:7754-7759 (1995); Guzelian, A. A., et al., "Synthesis of size-selected, surface-passivated InP nanocrystals," *J. Phys. Chem.* 100: 7212-7219 (1996); Lucey, D. W., et al., "Monodispersed InP quantum dots prepared by colloidal chemistry in a non-coordinating solvent," *Chem. Mater.* 17:3754-3762 (2005); Lim, J., et al., "InP@ZnSeS, core@composition gradient shell quantum dots with enhanced stability," *Chem. Mater.* 23:4459-4463 (2011); and Zan, F., et al., "Experimental studies on blinking behavior of single InP/ZnS quantum dots: Effects of synthetic conditions and UV irradiation," *J. Phys. Chem. C* 116:394-3950 (2012).

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, $CuInS_2$, $CuInSe_2$, AlN, AlP, AlAs, GaN, GaP, or GaAs.

Inorganic shell coatings on nanostructures are a universal approach to tailoring their electronic structure. Additionally, deposition of an inorganic shell can produce more robust particles by passivation of surface defects. Ziegler, J., et al., *Adv. Mater.* 20:4068-4073 (2008). For example, shells of wider band gap semiconductor materials such as ZnS can be deposited on a core with a narrower band gap—such as CdSe or InP—to afford structures in which excitons are confined within the core. This approach increases the probability of radiative recombination and makes it possible to synthesize very efficient quantum dots with quantum yields close to unity and thin shell coatings.

In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

In some embodiments, the nanostructures of the present disclosure include a core and at least one shell. In some embodiments, the nanostructures of the present disclosure include a core and at least two shells. The shell can, e.g., increase the quantum yield and/or stability of the nanostructures. In some embodiments, the core and the shell comprise different materials. In some embodiments, the nanostructure comprises shells of different shell material.

Exemplary materials for preparing shells include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, GaSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof.

In some embodiments, the shell is a mixture of at least two of a zinc source, a selenium source, a sulfur source, a tellurium source, and a cadmium source. In some embodiments, the shell is a mixture of two of a zinc source, a selenium source, a sulfur source, a tellurium source, and a cadmium source. In some embodiments, the shell is a mixture of three of a zinc source, a selenium source, a sulfur source, a tellurium source, and a cadmium source. In some embodiments, the shell is a mixture of: zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium and zinc; cadmium, zinc, and sulfur; cadmium, zinc, and selenium; or cadmium, zinc, sulfur, and selenium. In some embodiments, the shell is a mixture of zinc and selenium. In some embodiments, the shell is a mixture of zinc and sulfur.

Exemplary core/shell luminescent nanocrystals for use in the practice of the present disclosure include, but are not limited to (represented as core/shell) CdSe/ZnS, InP/ZnS, PbSe/PbS, CdSe/CdS, CdTe/CdS, and CdTe/ZnS. The synthesis of core/shell nanostructures is disclosed in U.S. Pat. No. 9,169,435.

In some embodiments, the nanostructures include a core and at least two shells. In some embodiments, one shell is a mixture of zinc and selenium and one shell is a mixture of zinc and sulfur. In some embodiments, the core/shell/shell nanostructure is InP/ZnSe/ZnS.

The luminescent nanocrystals can be made from a material impervious to oxygen, thereby simplifying oxygen barrier requirements and photostabilization of the quantum dots in the quantum dot film layer. In exemplary embodiments, the luminescent nanocrystals are coated with one or more organic polymeric ligand material and dispersed in an organic polymeric matrix comprising one or more matrix materials, as discussed in more detail below. The luminescent nanocrystals can be further coated with one or more inorganic layers comprising one or more material such as a silicon oxide, an aluminum oxide, or a titanium oxide (e.g., $SiO_2$, $Si_2O_3$, $TiO_2$, or $Al_2O_3$), to hermetically seal the quantum dots.

In some embodiments, the nanostructures comprise ligands bound to their surface. In some embodiments, the nanostructures include a coating layer comprising ligands to protect the quantum dots from external moisture and oxidation, to control aggregation, and to allow for dispersion of the nanostructures in the matrix material. Suitable ligands include those disclosed in U.S. Pat. Nos. 6,949,206; 7,267,875; 7,374,807; 7,572,393; 7,645,397; and 8,563,133 and in U.S. Patent Appl. Publication Nos. 2008/237540; 2008/281010; and 2010/110728.

In some embodiments, the nanostructure comprises a multi-part ligand structure, such as the three-part ligand structure disclosed in U.S. Patent Appl. Publication No. 2008/237540, in which the head-group, tail-group, and middle/body group are independently fabricated and optimized for their particular function, and then combined into an ideally functioning complete surface ligand.

In some embodiments, the ligands comprise one or more organic polymeric ligands. Suitable ligands provide: efficient and strong bonding quantum dot encapsulation with low oxygen permeability; precipitate or segregate into domain in the matrix material to form a discontinuous dual-phase or multi-phase matrix; disperse favorably throughout the matrix material; and are commercially available materials or can be easily formulated from commercially available materials.

In some embodiments, the ligand is a polymer, a glassy polymer, a silicone, a carboxylic acid, a dicarboxylic acid, a polycarboxylic acid, an acrylic acid, a phosphonic acid, a phosphonate, a phosphine, a phosphine oxide, a sulfur, or an amine.

In some embodiments, the population of nanostructures emits red, green, or blue light. In some embodiments, the respective portions of red, green, and blue light can be controlled to achieve a desired white point for the white light emitted by a display device incorporating a nanostructure film.

In some embodiments, the nanostructure composition comprises at least one population of nanostructure material. In some embodiments, the nanostructure composition comprises a population of between 1 and 5, between 1 and 4, between 1 and 3, between 1 and 2, between 2 and 5, between 2 and 4, between 2 and 3, between 3 and 5, between 3 and 4, or between 4 and 5 nanostructure materials. Any suitable ratio of the populations of nanostructures can be combined to create the desired nanostructure composition characteristics.

In some embodiments, the weight percentage of the population of nanostructures in the nanostructure composition is between about 0.0001% and about 5%, about 0.0001% and about 4%, about 0.0001% and about 3%, about 0.0001% and about 2%, about 0.0001% and about 1%, about 0.0001% and about 0.5%, about 0.0001% and about 0.1%, about 0.0001% and 0.01%, about 0.0001% and about 0.001%, about 0.001% and about 5%, about 0.001% and about 4%, about 0.001% and about 3%, about 0.001% and about 2%, about 0.001% and about 1%, about 0.001% and about 0.5%, about 0.001% and about 0.1%, about 0.001% and 0.01%, about 0.01% and about 5%, about 0.01% and about 4%, about 0.01% and about 3%, about 0.01% and about 2%, about 0.01% and about 1%, about 0.01% and about 0.5%, about 0.01% and about 0.1%, about 0.1% and about 5%, about 0.1% and about 4%, about 0.1% and about 3%, about 0.1% and about 2%, about 0.1% and about 1%, about 0.1% and about 0.5%, about 0.5% and about 5%, about 0.5% and about 4%, about 0.5% and about 3%, about 0.5% and about 2%, about 0.5% and about 1%, about 1% and about 5%, about 1% and about 4%, about 1% and about 3%, or about 1% and about 2%. In some embodiments, the nanostructure is a quantum dot.

In some embodiments, the weight percent of the population of nanostructures in the nanostructure molded article is between about 0.0001% and about 5%, about 0.0001% and about 4%, about 0.0001% and about 3%, about 0.0001% and about 2%, about 0.0001% and about 1%, about 0.0001% and about 0.5%, about 0.0001% and about 0.1%, about 0.0001% and 0.01%, about 0.0001% and about 0.001%, about 0.001% and about 5%, about 0.001% and about 4%, about 0.001% and about 3%, about 0.001% and about 2%, about 0.001% and about 1%, about 0.001% and about 0.5%, about 0.001% and about 0.1%, about 0.001% and 0.01%, about 0.01% and about 5%, about 0.01% and about 4%, about 0.01% and about 3%, about 0.01% and about 2%, about 0.01% and about 1%, about 0.01% and about 0.5%, about 0.01% and about 0.1%, about 0.1% and about 5%, about 0.1% and about 4%, about 0.1% and about 3%, about 0.1% and about 2%, about 0.1% and about 1%, about 0.1% and about 0.5%, about 0.5% and about 5%, about 0.5% and about 4%, about 0.5% and about 3%, about 0.5% and about 2%, about 0.5% and about 1%, about 1% and about 5%, about 1% and about 4%, about 1% and about 3%, or about 1% and about 2%. In some embodiments, the nanostructure is a quantum dot.

Reactive Diluent

In some embodiments, the nanostructures are dispersed in a reactive diluent. A suitable reactive diluent is substantially non-reactive with nanostructures under conditions used to prepare and store a nanostructure composition, but are capable of undergoing a reaction to form a polymer and/or interpenetrating network.

In some embodiments, the reactive diluent is capable of undergoing a radical polymerization reaction. In some embodiments, the reactive diluent comprises one or more monomers. In some embodiments, the reactive diluent comprises one or more oligomers.

In some embodiments, the reactive diluent has a radical-polymerizable group. In some embodiments, the radical-polymerizable group is an ethylenically unsaturated group. In some embodiments, the ethylenically unsaturated group is an acrylyloxy group, an acrylyloxyalkyl group, a methacrylyloxy group, a methacrylyloxyalkyl group, an acrylamide group, a methacrylamide group, a vinyloxy group, a vinyl carbonate group, an O-vinyl carbamate group, an N-vinyl carbamate group, an aromatic vinyl group, or a vinyl group.

In some embodiments, the reactive diluent is an acrylate. In some embodiments, the acrylate is a single acrylate compound or a mixture of different acrylate compounds. In some embodiments, the acrylate is monofunctional, difunctional, trifunctional, or of a higher functionality.

In some embodiments, the acrylate is monofunctional. In some embodiments, the monofunctional acrylate is isobornyl acrylate, tetrahydrofurfuryl acrylate, an ethoxylated phenyl acrylate, lauryl acrylate, stearyl acrylate, octyl acrylate, isodecyl acrylate, tridecyl acrylate, caprolactone acrylate, nonyl phenol acrylate, cyclic trimethylolpropane formal acrylate, a methoxy polyethyleneglycol acrylate, a methoxy polypropyleneglycol acrylate, hydroxyethyl acrylate, hydroxypropyl acrylate, or glycidyl acrylate.

In some embodiments, the acrylate is difunctional. In some embodiments, the difunctional acrylate is tricyclodecane dimethanol diacrylate (SARTOMER® 833s), dioxane glycerol diacrylate (SARTOMER® CD 536), 1,6-hexanediol diacrylate (SARTOMER® 238), 3-methyl 1,5-pentanediol diacrylate (SARTOMER® 341), tripropylene glycol diacrylate (SARTOMER® 306), neopentyl glycol diacrylate (SARTOMER® 247), dimethyloltricyclodecane diacrylate (KAYARAD® R-684), 1,4-dihydroxymethylcyclohexane diacrylate, 2,2-bis(4-hydroxy-cyclohexyl)propane diacrylate, or bis(4-hydroxycyclohexyl)methane diacrylate.

In some embodiments, the acrylate is an aromatic difunctional acrylate. In some embodiments, the aromatic difunctional acrylate is bisphenol A polyethylene glycol diether diacrylate (KAYARAD® R-551), 2,2'-methylenebis [p-phenylenepoly(oxyethylene)oxy]diethyl diacrylate (KAYARAD® R-712), hydroquinone diacrylate, 4,4'-dihydroxybiphenyl diacrylate, bisphenol A diacrylate, bisphenol F diacrylate, bisphenol S diacrylate, ethoxylated or propoxylated bisphenol A diacrylate, ethoxylated or propoxylated bisphenol F diacrylate, ethoxylated or propoxylated bisphenol S diacrylate, or bisphenol-A epoxy diacrylate.

In some embodiments, the acrylate is a polyethylenglycol difunctional acrylate. In some embodiments, the polyethyleneglycol difunctional acrylate is tetraethyleneglycol diacrylate (SARTOMER® 268), polyethyleneglycol (200) diacrylate (SARTOMER® 259), polyethyleneglycol (400) diacrylate (SARTOMER® 344).

In some embodiments, the acrylate is a trifunctional acrylate or an acrylate with even higher functionality. In some embodiments, the acrylate is hexane-2,4,6-triol triacrylate, glycerol triacrylate, 1,1,1-trimethylolpropane triacrylate, ethoxylated or propoxylated glycerol triacrylate, ethoxylated or propoxylated 1,1,1-trimethylolpropane triacrylate, pentaerythritol tetraacrylate, bistrimethylolpropane tetraacrylate, pentaerythritol monohydroxytriacrylate, dipentaerythritol monohydroxypentaacrylate, dipentaerythritol pentaacrylate (SARTOMER® 399), pentaerythritol triacrylate (SARTOMER® 444), pentaerythritol tetracrylate (SARTOMER® 295), trimethylolpropane triacrylate (SARTOMER® 351), tris(2-acryloxy ethyl) isocyanurate triacrylate (SARTOMER® 368), ethoxylated trimethylolpropane triacrylate (SARTOMER® 454), or dipentaerythritol pentaacrylate ester (SARTOMER® 9041). In some embodiments, the acrylate is an aromatic triacrylate reaction product of triglycidyl ethers of trihydric phenols and phenol or cresol novolaks (phenol-formaldehdye condensation polymer) containing three hydroxyl groups, with acrylic acid.

In some embodiments, the acrylate is a polyfunctional urethane acrylate. Urethane acrylates can be prepared by, e.g., reacting a hydroxyl-terminated polyurethane with acrylic acid, or by reacting an isocyanate-terminated prepolymer with a hydroxyalkyl acrylate to give the urethane acrylate. In some embodiments, the urethane acrylate is made from a polyester diol, an aliphatic isocyanate, or a hydroxyalkyl acrylate.

In some embodiments, the acrylate is a higher functionality acrylate, including hyberbranched polyester types. In some embodiments, the acrylate is a commercially available acrylate such as CN2301, CN2302, CN2303, CN2304 from SARTOMER®.

In some embodiments, the acrylate is a commercially available acrylate such as KAYARAD® D-310, D-330, DPHA-2H, DPHA-2C, DPHA-21, DPCA-20, DPCA-30, DPCA-60, DPCA-120, DN-0075, DN-2475, T-2020, T-2040, TPA-320, TPA-330 T-1420, PET-30, THE-330, and RP-1040 from Nippon Kayaku Co., Ltd., Tokyo, Japan; R-526, R-604, R-011, R-300 and R-205 from Nippon Kayaku Co., Ltd., Tokyo, Japan; ARONIX® M-210, M-220, M-233, M-240, M-215, M-305, M-309, M-310, M-315, M-325, M-400, M-6200, and M-6400 from Toagosei Chemical Industry Co., Ltd., Tokyo, Japan; light acrylate BP-4EA, BP-4PA, BP-2EA, BP-2PA, and DCP-A from Kyoeisha Chemical Industry Co., Ltd., Osaka, Japan; New Frontier BPE-4, TEICA, BR-42M, and GX-8345 from Daichi Kogyo Seiyaku Co., Ltd., Tokyo, Japan; ASF-400 from Nippon Steel Chemical Co., Ltd., Tokyo, Japan; Ripoxy SP-1506, SP-1507, SP-1509, VR-77, SP-4010 and SP-4060 from Showa Highpolymer Co., Ltd., Tokyo, Japan; NK Ester A-BPE-4 from Shin-Nakamura Chemical Industry Co., Ltd., Wakayama, Japan; SA-1002 from Mitsubishi Chemical Co., Ltd., Tokyo, Japan; or Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, and Viscoat-3700 from Osaka Organic Chemical Industry Co., Ltd., Osaka, Japan.

In some embodiments, the reactive diluent is a methacrylate. In some embodiments, the methacrylate is a single methacrylate compound or a mixture of different methacrylate compounds. In some embodiments, the methacrylate is monofunctional, difunctional, trifunctional, or of higher functionality.

In some embodiments, the methacacrylate is monofunctional. In some embodiments, the monofunctional methacrylate is isobornyl methacrylate, tetrahydrofurfuryl methacrylate, ethoxylated phenyl methacrylate, lauryl methacrylate, stearyl methacrylate, octyl methacrylate, isodecyl methacrylate, tridecyl methacrylate, caprolactone methacrylate, nonyl phenol methacrylate, cyclic trmethylolpropane formal methacrylate, methoxy polyethyleneglycol methacrylates, methoxy polypropyleneglycol methacrylates, hydroxyethyl methacrylate, hydroxypropyl methacrylate, or glycidyl methacrylate.

In some embodiments, the methacrylate is an aliphatic or cycloaliphatic difunctional methacrylate such as 1,4-dihydroxymethylcyclohexane dimethacrylate, 2,2-bis(4-hydroxy-cyclohexyl)propane dimethacrylate, or bis(4-hydroxycyclohexyl)methane dimethacrylate.

In some embodiments, the methacrylate is an aromatic difunctional methacrylate such as ethoxylated (2) bisphenol A dimethacrylate (SARTOMER® 10 IK), ethoxylated (2) bisphenol A dimethacrylate (SARTOMER® 348L), ethoxylated (3) bisphenol A dimethacrylate (SARTOMER® 348C), ethoxylated (4) bisphenol A dimethacrylate (SARTOMER® 150), ethoxylated (4) bisphenol A dimethacrylate (SARTOMER® 540), ethoxylated (10) bisphenol A dimethacrylate (SARTOMER® 480), hydroquinone dimethacrylate, 4,4'-dihydroxybiphenyl dimethacrylate, bisphenol A dimethacrylate, bisphenol F dimethacrylate, bisphenol S dimethacrylate, ethoxylated or propoxylated bisphenol A dimethacrylate, ethoxylated or propoxylated bisphenol F dimethacrylate, or ethoxylated or propoxylated bisphenol S dimethacrylate.

In some embodiments, the methacrylate is a trifunctional methacrylate or a methacrylate with higher functionality such as tricyclodecane dimethanol dimethacrylate (SARTOMER® 834), trimethylolpropane trimethacrylate (SARTOMER® 350), tetramethylolmethane tetramethacrylate (SARTOMER® 367), hexane-2,4,6-triol trimethacrylate, glycerol trimethacrylate, 1,1,1-trimethylolpropane trimethacrylate, ethoxylated or propoxylated glycerol trimethacrylate, ethoxylated or propoxylated 1,1,1-trimethylolpropane trimethacrylate, pentaerythritol tetramethacrylate, bistrimethylolpropane tetramethacrylate, pentaerythritol monohydroxytrmethiacrylate, or dipentaerythritol monohydroxypentamethacrylate.

In some embodiments, the methacrylate is an aromatic trifunctional methacrylate. In some embodiments, the aromatic trifunctional methacrylate is the reaction product of a triglycidyl ether of a trihydric phenol with phenol or cresol novolaks containing three hydroxy groups, with methacrylic acid. In some embodiments, the aromatic trimethacrylates is the reaction product of a triglycidyl ether of a trihydric phenol with a phenol or cresol novolak containing three hydroxy groups, with methacrylic acid.

In some embodiments, the reactive diluents is selected from the group consisting of isobornyl acrylate, isobornyl methacrylate, lauryl methacrylate, tricyclodecane dimethanol diacrylate, trimethylolpropane triacrylate, trimethylolpropane trimethacrylate, 1,3,5-Triallyl-1,3,5-triazine-2,4,6(1H,3H,5H)-trione, and combinations thereof.

In some embodiments, the nanostructure composition comprises at least one reactive diluent. In some embodiments, the nanostructure composition comprises between 1 and 5, between 1 and 4, between 1 and 3, between 1 and 2, between 2 and 5, between 2 and 4, between 2 and 3, between 3 and 5, between 3 and 4, or between 4 and 5 reactive diluents.

The reactive diluent can be present in any suitable amount. For example, the reactive diluent can be present in an amount that is more than, about the same as, or less than (weight/weight) compared to the nanostructures. In some embodiments, the weight ratio of the reactive diluent to the nanostructures is about 1000:1 to about 1:1000, about 1000:1 to about 1:500, about 1000:1 to about 1:200, about 1000:1 to about 1:100, about 1000:1 to about 1:50, about 1000:1 to about 1:10, about 1000:1 to about 1:1, about 500:1 to about 1:1000, about 500:1 to about 1:500, about 500:1 to about 1:200, about 500:1 to about 1:100, about 500:1 to about 1:50, about 500:1 to about 1:10, about 500:1 to about 1:1, about 200:1 to about 1:1000, about 200:1 to about 1:500, about 200:1 to about 1:200, about 200:1 to about 1:100, about 200:1 to about 1:50, about 200:1 to about 1:10, about 200:1 to about 1:1, about 100:1 to about 1:1000, about 100:1 to about 1:500, about 100:1 to about 1:200, about 100:1 to about 1:100, about 100:1 to about 1:50, about 100:1 to about 1:10, about 100:1 to about 1:1, about 50:1 to about 1:1000, about 50:1 to about 1:500, about 50:1 to about 1:200, about 50:1 to about 1:100, about 50:1 to about 1:50, about 50:1 to about 1:10, about 50:1 to about 1:1, about 10:1 to about 1:1000, about 10:1 to about 1:500, about 1:10, to about 1:200, about 10:1 to about 1:100, about 10:1 to about 1:50, about 10:1 to about 1:10, about 10:1 to about 1:1. In some embodiments, the weight ratio of the reactive diluent to the nanostructures is about 1000:1, about 500:1, about 200:1, about 100:1, about 50:1, about 10:1, about 1:1, about 1:10, about 1:50, about 1:100, about 1:200, about 1:500, or about 1:1000.

In some embodiments, the weight percentage of the reactive diluent in the nanostructure is between about 0.01% and about 99%, about 0.01% and about 95%, about 0.01% and about 90%, about 0.01% and about 80%, about 0.01% and about 70%, about 0.01% and about 60%, about 0.01% and about 50%, about 0.01% and about 25%, about 0.01% and about 20%, about 0.01% and about 15%, about 0.01% and about 10%, about 0.01% and about 5%, about 0.01% and about 2%, about 0.01% and about 1%, about 1% and about 99%, about 1% and about 95%, about 1% and about 90%, about 1% and about 80%, about 1% and about 70%, about 1% and about 60%, about 1% and about 50%, about 1% and about 25%, about 1% and about 20%, about 1% and about 15%, about 1% and about 10%, about 1% and about 5%, about 1% and about 2%, about 2% and about 99%, about 2% and about 95%, about 2% and about 90%, about 2% and about 80%, about 2% and about 70%, about 2% and about 60%, about 2% and about 50%, about 2% and about 25%, about 2% and about 20%, about 2% and about 15%, about 2% and about 10%, about 2% and about 5%, about 5% and about 99%, about 5% and about 95%, about 5% and about 90%, about 5% and about 80%, about 5% and about 70%, about 5% and about 60%, about 5% and about 50%, about 5% and about 25%, about 5% and about 20%, about 5% and about 15%, about 5% and about 10%, about 10% and about 99%, about 10% and about 95%, about 10% and about 90%, about 10% and about 80%, about 10% and about 70%, about 10% and about 60%, about 10% and about 50%, about 10% and about 25%, about 10% and about 20%, about 10% and about 15%, about 15% and about 50%, about 15% and about 25%, about 15% and about 20%, about 20% and about 99%, about 20% and about 95%, about 20% and about 90%, about 20% and about 80%, about 20% and about 70%, about 20% and about 60%, about 20% and about 50%, about 20% and about 25%, about 25% and about 99%, about 25% and about 95%, about 25% and about 90%, about 25% and about 80%, about 25% and about 70%, about 25% and about 60%, about 25% and about 50%, about 50% and about 99%, about 50% and about 95%, about 50% and about 90%, about 50% and about 80%, about 50% and about 70%, about 50% and about 60%, about 60% and about 99%, about 60% and about 95%, about 60% and about 90%, about 60% and about 80%, about 60% and about 70%, about 70% and about 99%, about 70% and about 95%, about 70% and about 90%, about 70% and about 80%, about 80% and about 90%, about 80% and about 90%, about 80% and about 95%, about 80% and about 99%, about 90% and about 95%, about 90% and about 99%, or about 95% and about 99%.

In some embodiments, the weight percentage of the reactive diluent in the nanostructure molded article is between about 0.01% and about 99%, about 0.01% and about 95%, about 0.01% and about 90%, about 0.01% and about 80%, about 0.01% and about 70%, about 0.01% and about 60%, about 0.01% and about 50%, about 0.01% and about 25%, about 0.01% and about 20%, about 0.01% and about 15%, about 0.01% and about 10%, about 0.01% and about 5%, about 0.01% and about 2%, about 0.01% and about 1%, about 1% and about 99%, about 1% and about 95%, about 1% and about 90%, about 1% and about 80%, about 1% and about 70%, about 1% and about 60%, about 1% and about 50%, about 1% and about 25%, about 1% and about 20%, about 1% and about 15%, about 1% and about 10%, about 1% and about 5%, about 1% and about 2%, about 2% and about 99%, about 2% and about 95%, about 2% and about 90%, about 2% and about 80%, about 2% and about 70%, about 2% and about 60%, about 2% and about 50%, about 2% and about 25%, about 2% and about 20%, about 2% and about 15%, about 2% and about 10%, about 2% and about 5%, about 5% and about 99%, about 5% and about 95%, about 5% and about 90%, about 5% and about 80%, about 5% and about 70%, about 5% and about 60%, about 5% and about 50%, about 5% and about 25%, about 5% and about 20%, about 5% and about 15%, about 5% and about 10%, about 10% and about 99%, about 10% and about 95%, about 10% and about 90%, about 10% and about 80%, about 10% and about 70%, about 10% and about 60%, about 10% and about 50%, about 10% and about 25%, about 10% and about 20%, about 10% and about 15%, about 15% and about 50%, about 15% and about 25%, about 15% and about 20%, about 20% and about 99%, about 20% and about 95%, about 20% and about 90%, about 20% and about 80%, about 20% and about 70%, about 20% and about 60%, about 20% and about 50%, about 20% and about 25%, about 25% and about 99%, about 25% and about 95%, about 25% and about 90%, about 25% and about 50%, about 25% and about 70%, about 25% and about 60%, about 25% and about 50%, about 50% and about 99%, about 0% and about 95%, about 50% and about 90%, about 50% and about 80%, about 50% and about 70%, about 50% and about 60%, about 60% and about 99%, about 60% and about 95%, about 60% and about 90%, about 60% and about 80%, about 60% and about 70%, about 70% and about 99%, about 70% and about 95%, about 70% and about 90%, about 70% and about 80%, about 80% and about 90%, about 80% and about 90%, about 80% and about 95%, about 80% and about 99%, about 90% and about 95%, about 90% and about 99%, or about 95% and about 99%.

Non-Reactive Diluent

In some embodiments, the nanostructure composition comprises a non-reactive diluent. A suitable non-reactive diluent is substantially non-reactive with nanostructures under conditions used to prepare and store a nanostructure composition, and are not reactive under reaction conditions, e.g., are not capable of undergoing a radical polymerization reaction.

In some embodiments, the non-reactive diluent is selected from the group consisting of formic acid, acetic acid, chloroform, acetone, butanone, fatty alcohol and ethylene glycol monomethyl ether, ethylene glycol monoethyl ether, ethylene glycal monopropyl ether, ethylene glycol monobutyl ether, diethylene glycol diethyl ether acetic acetate, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, toluene, xylene, isopropyl alcohol, water, methanol, ethanol, acetonitrile, chlorobenzene, benzene, hexane, heptane, octane, and combinations thereof Anaerobic Stabilizer In some embodiments, an anaerobic stabilizer is added to a composition comprising nanostructures. In some embodiments, an anaerobic stabilizer is added to a composition comprising nanostructures dispersed in a reactive diluent. In some embodiments, an anaerobic stabilizer is added to a composition comprising nanostructures dispersed in a solvent. In some embodiments, an anaerobic stabilizer is added to a composition comprising nanostructures dispersed in a non-reactive diluent.

In some embodiments, a nanostructure composition comprises at least one population of nanostructures, at least one reactive diluent, at least one anaerobic stabilizer, and optionally at least one organic resin. In some embodiments, the nanostructure composition further comprises a solvent. In some embodiments, the anaerobic stabilizer increases the stability of the nanostructure compositions. In some embodiments, the nanostructure is a quantum dot.

In some embodiments, an anaerobic stabilizer is added to a reactive diluent. While not wishing to be bound by any theory, it is understood that a reactive diluent is vulnerable to uncontrolled polymerization under an anaerobic condition because its inhibitor(s), such as MEHQ (p-methoxyphenol), requires oxygen to function effectively. When an anaerobic stabilizer is combined with a reactive diluent, it is understood that the anaerobic stabilizer acts as an anaerobic radical scavenger to prevent the reactive diluent from uncontrolled polymerization during preparation and storage of a nanostructure composition.

In some embodiments, the anaerobic stabilizer is a nitroxide-containing compound or a nitroso-containing compound. In some embodiments, the anaerobic stabilizer comprises a

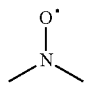

group. Non-limiting exemplary anaerobic stabilizers are described in U.S. Pat. No. 6,509,428 B2, as represented by the following formulae:

(I)

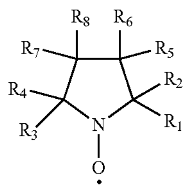

(II)

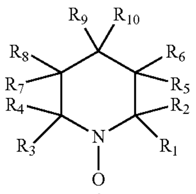

(III)

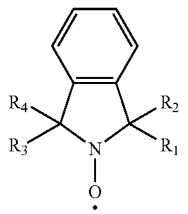

(IV)

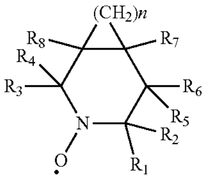

(V)

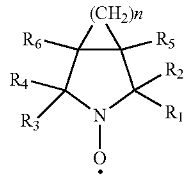

(VI)

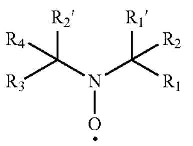

-continued (VII)

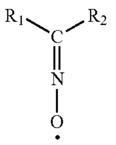

(VIII)

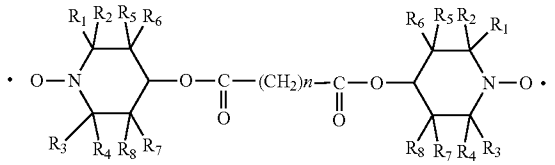

(IX)

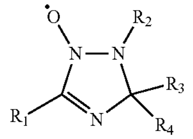

(X)

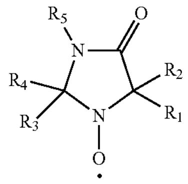

(XI)

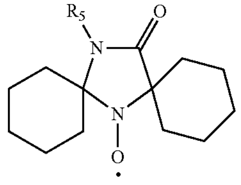

in which n represents a non-zero integer and $R_1$, $R_2$, $R_3$, $R_4$, $R_1'$, and $R_2'$, which can be identical or different, represent a hydrogen atom, a halogen atom, such as chlorine, bromine or iodine, a saturated or unsaturated, linear, branched or cyclic hydrocarbon-comprising group, such as an alkyl or phenyl radical, or a —COOR ester group or an —OR alkoxy group, or a $—PO(OR)_2$ phosphonate group, or a polymer chain which can, for example be a poly(alkyl (meth)acrylate) chain, such as poly(methyl methacrylate), a polydiene chain, such as polybutadiene, or a polyolefin chain, such as polyethylene or polypropylene, but preferably being a polystyrene chain, and in which $R_5$, $R_6$, $R_7$, $R_8$, $R_9$ and $R_{10}$, which can be identical or different, can be chosen from the same family of groups as that which has just been envisaged for $R_1$, $R_2$, $R_3$, $R_4$, $R'_1$ and $R'_2$ and furthermore can represent an —OH hydroxide group or an acid group, such as —COOH or $—PO(OH)_2$ or $—SO_3H$.

In some embodiments, the anaerobic stabilizer is selected from the group consisting of:

2,2,6,6-tetramethyl-1-piperidinyloxy (commonly known as TEMPO), 4-hydroxy-2,2,6,6-tetramethyl-1-piperidinyloxy (commonly known as 4-hydroxy-TEMPO), 4-methoxy-2,2,6,6-tetramethyl-1-piperidinyloxy (commonly known as 4-methoxy-TEMPO), 4-oxo-2,2,6,6-tetramethyl-1-piperidinyloxy (commonly known as 4-oxo-TEMPO), 4-amino-2,2,6,6-tetramethyl-1-piperidinyloxy, 4-carboxy-2,2,6,6-tetramethyl-1-piperidinyloxy
4-acetamido-2,2,6,6-tetramethyl-1-piperidinyloxy,
4-(2-bromoacetamido)-2,2,6,6-tetramethyl-1-piperidinyloxy,
2,2,5,5-tetramethyl-1-pyrrolidinyloxy,
3-aminomethyl-2,2,5,5-tetramethyl-1-pyrrolidinyloxy,
3-carboxy-2,2,5,5-tetramethyl-1-pyrrolidinyloxy,
3-maleimido-2,2,5,5-tetramethyl-1-pyrrolidinyloxy,
3-cyano-2,2,5,5-tetramethyl-1-pyrrolidinyloxy,
3-carbamoyl-2,2,5,5-tetramethyl-1-pyrrolidinyloxy,
3-(2-iodoacetamido)-2,2,5,5-tetramethyl-1-pyrrolidinyloxy
1-oxyl-2,2,6,6-tetramethylpiperidin-4-yl acetate,
1-oxyl-2,2,6,6-tetramethylpiperidin-4-yl 2-ethylhexanoate,
1-oxy-2,2,6,6-tetramethylpiperidin-4-yl stearate,
1-oxyl-2,2,6,6-tetramethylpiperidin-4-yl benzoate,
1-oxyl-2,2,6,6-tetramethylpiperidin-4-yl 4-tert-butylbenzoate,
bis(1-oxyl-2,2,6,6-tetramethylpiperidin-4-yl) succinate,
bis(1-oxyl-2,2,6,6-tetramethylpiperidin-4-yl) adipate,
bis(1-oxyl-2,2,6,6-tetramethylpiperidin-4-yl) sebacate,
bis(1-oxyl-2,2,6,6-tetramethylpiperidin-4-yl) n-butylmalonate,
bis(1-oxyl-2,2,6,6-tetramethylpiperidin-4-yl) phthalate,
bis(1-oxyl-2,2,6,6-tetramethylpiperidin-4-yl)isophthalate,
bis(1-oxyl-2,2,6,6-tetramethylpiperidin-4-yl) terephthalate,
bis(1-oxyl-2,2,6,6-tetramethylpiperidin-4-yl)hexahydroterephthalate,
N,N'-bis(1-oxyl-2,2,6,6-tetramethylpiperidin-4-yl)adipamide,
N-(1-oxyl-2,2,6,6-tetramethylpiperidin-4-yl)caprolactam,
N-(1-oxyl-2,2,6,6-tetramethylpiperidin-4-yl)dodecylsuccinimide.
2,4,6-tris-(1-oxyl-2,2,6,6-tetramethylpiperidin-4-yl) cyanurate,
2,4,6-tris-[N-butyl-N-(1-oxyl-2,2,6,6-tetramethylpiperidin-4-yl]-s-triazine,
4,4'-ethylenebis(1-oxyl-2,2,6,6-tetramethylpiperazin-3-one),
di-tert-butyl nitroxyl,
N-tert-butyl-1-phenyl-2-methylpropyl nitroxide,
N-tert-butyl-1-(2-naphthyl)-2-methylpropyl nitroxide,
N-tert-butyl-1-diethylphosphono-2,2-dimethylpropyl nitroxide,
N-tert-butyl-1-dibenzylphosphono-2,2-dimethylpropyl nitroxide,
N-phenyl-1-diethylphosphono-2,2-dimethylpropyl nitroxide,
N-phenyl-1-diethylphosphono-1-methylethyl nitroxide,
N-(1-phenyl-2-methylpropyl)-1-diethylphosphono-1-methylethyl nitroxide,
N-tert-butyl-1-di(2,2,2-trifluoroethyl)phosphono-2,2-dimethylpropyl nitroxide,
N-tert-butyl-1-diethylphosphono-2-methylpropyl nitroxide,
N-(1-methylethyl)-1-(diethylphosphono)cyclohexyl nitroxide,
N-(1-phenylbenzyl)-1-diethylphosphono-1-methylethyl nitroxide,
2,4,6-tri(tert-butyl)phenoxy,
1-nitroso-2-naphthol,
2-nitroso-1-naphthol,
4-nitroso-1-naphthol,
t-nitrosobutane,
p-nitrosophenol,
2,3-dimethyl-4-nitrosophenol,
2,5-dimethyl-4-nitrosophenol,
2,6-dimethyl-4-nitrosophenol,
2-chloro-4-nitrosophenol,
2-methyl-4-nitrosophenol,
3,5-dimethyl-4-nitrosophenol,
3-methyl-4-nitrosophenol,
5-(diethylamino)-2-nitrosophenol,
2-isopropyl-5-methyl-4-nitrosophenol, and
combinations thereof.

In some embodiments, the anaerobic stabilizer is TEMPO. In some embodiments, the anaerobic stabilizer is 4-hydroxy-TEMPO.

In some embodiments, the nanostructure composition comprises at least one anaerobic stabilizer. In some embodiments, the nanostructure composition comprises between 1 and 5, between 1 and 4, between 1 and 3, between 1 and 2, between 2 and 5, between 2 and 4, between 2 and 3, between 3 and 5, between 3 and 4, or between 4 and 5 anaerobic stabilizers.

In some embodiments, the nanostructure composition comprises as a weight percentage between about 0.1 ppm and about 1000 ppm, about 0.1 ppm and about 750 ppm, about 0.1 ppm and about 500 ppm, about 0.1 ppm and about 250 ppm, about 0.1 ppm and about 200 ppm, about 0.1 ppm and about 100 ppm, about 0.1 ppm and about 50 ppm, about 0.1 ppm and about 10 ppm, about 0.1 ppm and about 1 ppm, about 1 ppm and about 1000 ppm, about 1 ppm and about 750 ppm, about 1 ppm and about 500 ppm, about 1 ppm and about 250 ppm, about 1 ppm and about 200 ppm, about 1 ppm and about 100 ppm, about 1 ppm and about 50 ppm, about 1 ppm and about 10 ppm, about 10 ppm and about 1000 ppm, about 10 ppm and about 750 ppm, about 10 ppm and about 500 ppm, about 10 ppm and about 250 ppm, about 10 ppm and about 200 ppm, about 10 ppm and about 100 ppm, about 10 ppm and about 50 ppm, about 50 ppm and about 1000 ppm, about 50 ppm and about 750 ppm, about 50 ppm and about 500 ppm, about 50 ppm and about 250 ppm, about 50 ppm and about 200 ppm, about 50 ppm and about 100 ppm, about 100 ppm and about 1000 ppm, about 100 ppm and about 750 ppm, about 100 ppm and about 500 ppm, about 100 ppm and about 250 ppm, about 100 ppm and about 200 ppm, about 200 ppm and about 1000 ppm, about 200 ppm and about 750 ppm, about 200 ppm and about 500 ppm, about 200 ppm and about 250 ppm, about 250 ppm and about 1000 ppm, about 250 ppm and about 750 ppm, about 250 ppm and about 500 ppm, about 500 ppm and about 1000 ppm, about 500 ppm and about 750 ppm, or about 750 ppm and about 1000 ppm, of the at least one anaerobic stabilizer in relation to the at least one reactive diluent.

Solvents

In some embodiments, the nanostructure composition further comprises a solvent. In some embodiments, the solvent is selected from the group consisting of formic acid, acetic acid, chloroform, acetone, butanone, fatty alcohol and ethylene glycol monomethyl ether, ethylene glycol monoethyl ether, ethylene glycol monopropyl ether, ethylene glycol monobutyl ether, diethylene glycol diethyl ether acetic acetate, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, toluene, xylene, isopropyl alcohol, water, methanol, ethanol, acetonitrile, chlorobenzene, benzene, hexane, heptane, octane, and combinations thereof.

Organic Resin

In some embodiments, the nanostructure composition further comprises an organic resin.

In some embodiments, the nanostructure composition comprises at least one population of nanostructures, at least one reactive diluent, at least one anaerobic stabilizer, and at least one organic resin. In some embodiments, the nanostructure is a quantum dot.

In some embodiments, the organic resin is a thermosetting resin or a ultraviolet (UV) curable resin. In some embodiments, the organic resin is cured by a method that facilitates roll-to-roll processing.

Thermosetting resins require curing in which they undergo an irreversible molecular cross-linking process which renders the resin infusible. In some embodiments, the thermosetting resin is an epoxy resin, a phenolic resin, a vinyl resin, a melamine resin, a urea resin, an unsaturated polyester resin, a polyurethane resin, an allyl resin, an acrylic resin, a polyamide resin, a polyamide-imide resin, a phenolamine condensation polymerization resin, a urea melamine condensation polymerization resin, or combinations thereof.

In some embodiments, the thermosetting resin is an epoxy resin. Epoxy resins are easily cured without evolution of volatiles or by-products by a wide range of chemicals. Epoxy resins are also compatible with most substrates and tend to wet surfaces easily. See Boyle, M. A., et al., "Epoxy Resins," Composites, Vol. 21, ASM Handbook, pages 78-89 (2001).

In some embodiments, the organic resin is a silicone thermosetting resin. In some embodiments, the silicone thermosetting resin is OE6630A or OE6630B (Dow Corning Corporation, Auburn, Mich.).

In some embodiments, a thermal initiator is used. In some embodiments, the thermal initiator is AIBN [2,2'-Azobis(2-methylpropionitrile)] or benzoyl peroxide.

UV curable resins are polymers that cure and quickly harden when exposed to a specific light wavelength. In some embodiments, the UV curable resin is a resin having as a functional group a radical-polymerization group such as a (meth)acrylyloxy group, a vinyloxy group, a styryl group, or a vinyl group; a cation-polymerizable group such as an epoxy group, a thioepoxy group, a vinyloxy group, or an oxetanyl group. In some embodiments, the UV curable resin is a polyester resin, a polyether resin, a (meth)acrylic resin, an epoxy resin, a urethane resin, an alkyd resin, a spiroacetal resin, a polybutadiene resin, or a polythiolpolyene resin.

In some embodiments, the UV curable resin is selected from the group consisting of urethane acrylate, allyloxylated cyclohexyl diacrylate, bis(acryloxy ethyl)hydroxyl isocyanurate, bis(acryloxy neopentylglycol)adipate, bisphenol A diacrylate, bisphenol A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythritol hexaacrylate, dipentaerythritol monohydroxy pentaacrylate, di(trimethylolpropane) tetraacrylate, ethyleneglycol dimethacrylate, glycerol methacrylate, 1,6-hexanediol diacrylate, neopentylglycol dimethacrylate, neopentylglycol hydroxypivalate diacrylate, pentaerythritol triacrylate, pentaerythritol tetraacrylate, phosphoric acid dimethacrylate, polyethyleneglycol diacrylate, polypropyleneglycol diacrylate, tetraethyleneglycol diacrylate, tetrabromobisphenol A diacrylate, triethyleneglycol divinylether, triglycerol diacrylate, trimethylolpropane triacrylate, tripropyleneglycol diacrylate, tris(acryloxyethyl) isocyanurate, phosphoric acid triacrylate, phosphoric acid diacrylate, acrylic acid propargyl ester, vinyl terminated polydimethylsiloxane, vinyl terminated diphenylsiloxane-dimethylsiloxane copolymer, vinyl terminated polyphenylmethylsiloxane, vinyl terminated trifluoromethylsiloxane-dimethylsiloxane copolymer, vinyl terminated diethylsiloxane-dimethylsiloxane copolymer, vinylmethylsiloxane, monomethacryloyloxypropyl terminated polydimethyl siloxane, monovinyl terminated polydimethyl siloxane, monoallyl-mono trimethylsiloxy terminated polyethylene oxide, and combinations thereof.

In some embodiments, the UV curable resin is a mercapto-functional compound that can be cross-linked with an isocyanate, an epoxy, or an unsaturated compound under UV curing conditions. In some embodiments, the polythiol is pentaerythritol tetra(3-mercapto-propionate) (PETMP): trimethylol-propane tri(3-mercapto-propionate) (TMPMP); glycol di(3-mercapto-propionate) (GDMP); tris[25-(3-mercapto-propionyloxy)ethyl]isocyanurate (TEMPIC); di-pentaerythritol hexa(3-mercapto-propionate) (Di-PETMP): ethoxylated trimethylolpropane tri(3-mercapto-propionate) (ETTMP 1300 and ETTMP 700): polycaprolactone tetra(3-mercapto-propionate) (PCL4MP 1350); pentaerythritol tetramercaptoacetate (PETMA); trimethylol-propane trimercaptoacetate (TMPMA): or glycol dimercaptoacetate (GDMA). These compounds are sold under the trade name THIOCURE® by Bruno Bock, Marschacht, Germany.

In some embodiments, the UV curable resin is a polythiol. In some embodiments, the UV curable resin is a polythiol selected from the group consisting of ethylene glycol bis (thioglycolate), ethylene glycol bis(3-mercaptopropionate), trimethylol propane tris (thioglycolate), trimethylol propane tris (3-mercaptopropionate), pentaerythritol tetrakis (thioglycolate), pentaerythritol tetrakis(3-mercaptopropionate) (PETMP), and combinations thereof. In some embodiments, the UV curable resin is PETMP.

In some embodiments, the UV curable resin is a thiol-ene formulation comprising a polythiol and 1,3,5-Triallyl-1,3,5-triazine-2,4,6 (1H,3H,5H)-trione (TTT). In some embodiments, the UV curable resin is a thiol-ene formulation comprising PETMP and TTT.

In some embodiments, the UV curable resin further comprises a photoinitiator. A photoinitiator initiates the crosslinking and/or curing reaction of the photosensitive material during exposure to light. In some embodiments, the photoinitiator is acetophenone-based, benzoin-based, or thioxathenone-based.

In some embodiments, the photoinitiator is a vinyl acrylate-based resin. In some embodiments, the photoinitiator is MINS-311RM (Minuta Technology Co., Ltd, Korea).

In some embodiments, the photoinitiator is IRGACURE® 127, IRGACURE® 184, IRGACURE® 184D, IRGACURE® 2022, IRGACURE® 2100, IRGACURE® 250, IRGACURE® 270, IRGACURE® 2959, IRGACURE® 369, IRGACURE® 369 EG, IRGACURE® 379, IRGACURE® 500, IRGACURE® 651, IRGACURE® 754, IRGACURE® 784, IRGACURE® 819, IRGACURE® 819Dw, IRGACURE® 907, IRGACURE® 907 FF, IRGACURE® Oxe01, IRGACURE® TPO-L, IRGACURE® 1173, IRGACURE® 1173D, IRGACURE® 4265, IRGACURE® BP, or IRGACURE® MBF (BASF Corporation, Wyandotte, Mich.). In some embodiments, the photoinitiator is TPO (2,4,6-trimethylbenzoyl-diphenyl-phosphine oxide) or MBF (methyl benzoylformate).

In some embodiments, the weight percentage of the at least one organic resin in the nanostructure composition is between about 5% and about 99%, about 5% and about 95%, about 5% and about 90%, about 5% and about 80%, about 5% and about 70%, about 5% and about 60%, about 5% and about 50%, about 5% and about 40%, about 5% and about 30%, about 5% and about 20%, about 5% and about 10%, about 10% and about 99%, about 10% and about 95%, about 10% and about 90%, about 10% and about 80%, about 10% and about 70%, about 10% and about 60%, about 10% and about 50%, about 10% and about 40%, about 10% and about 30%, about 10% and about 20%, about 20% and about 99%, about 20% and about 95%, about 20% and about 90%, about 20% and about 80%, about 20% and about 70%, about 20% and about 60%, about 20% and about 50%, about 20% and about 40%, about 20% and about 30%, about 30% and about 99%, about 30% and about 95%, about 30% and about 90%, about 30% and about 80%, about 30% and about 70%, about 30% and about 60%, about 30% and about 50%, about 30% and about 40%, about 40% and about 99%, about 40% and about 95%, about 40% and about 90%, about 40% and about 80%, about 40% and about 70%, about 40% and about 60%, about 40% and about 50%, about 50% and about 99%, about 50% and about 95%, about 50% and about 90%, about 50% and about 80%, about 50% and about 70%, about 50% and about 60%, about 60% and about 99%, about 60% and about 95%, about 60% and about 90%, about 60% and about 80%, about 60% and about 70%, about 70% and about 99%, about 70% and about 95%, about 70% and about 90%, about 70% and about 80%, about 80% and about 99%, about 80% and about 95%, about 80% and about 90%, about 90% and about 99%, about 90% and about 95%, or about 95% and about 99%.

In some embodiments, the weight percentage of the organic resin in the nanostructure molded article is between about 5% and about 99%, about 5% and about 95%, about 5% and about 90%, about 5% and about 80%, about 5% and about 70%, about 5% and about 60%, about 5% and about 50%, about 5% and about 40%, about 5% and about 30%, about 5% and about 20%, about 5% and about 10%, about 10% and about 99%, about 10% and about 95%, about 10% and about 90%, about 10% and about 80%, about 10% and about 70%, about 10% and about 60%, about 10% and about 50%, about 10% and about 40%, about 10% and about 30%, about 10% and about 20%, about 20% and about 99%, about 20% and about 95%, about 20% and about 90%, about 20% and about 80%, about 20% and about 70%, about 20% and about 60%, about 20% and about 50%, about 20% and about 40%, about 20% and about 30%, about 30% and about 99%, about 30% and about 95%, about 30% and about 90%, about 30% and about 80%, about 30% and about 70%, about 30% and about 60%, about 30% and about 50%, about 30% and about 40%, about 40% and about 99%, about 40% and about 95%, about 40% and about 90%, about 40% and about 80%, about 40% and about 70%, about 40% and about 60%, about 40% and about 50%, about 50% and about 99%, about 50% and about 95%, about 50% and about 90%, about 50% and about 80%, about 50% and about 70%, about 50% and about 60%, about 60% and about 99%, about 60% and about 95%, about 60% and about 90%, about 60% and about 80%, about 60% and about 70%, about 70% and about 99%, about 70% and about 95%, about 70% and about 90%, about 70% and about 80%, about 80% and about 99%, about 80% and about 95%, about 80% and about 90%, about 90% and about 99%, about 90% and about 95%, or about 95% and about 99%.

Making the Nanostructure Compositions

The present disclosure provides a method of making a nanostructure composition comprising admixing at least one population of nanostructures, at least one reactive diluent, at least one anaerobic stabilizer, and optionally at least one organic resin.

The present disclosure provides a method of preparing a nanostructure composition, the method comprising:

(a) providing a composition comprising at least one population of nanostructures and at least one solvent;
(b) admixing at least one reactive diluent and at least one anaerobic stabilizer with the composition of (a); and
(c) removing the at least one solvent in the composition of (b).

In some embodiments, wherein the admixing in (b) further comprises:

(1) dissolving the at least one anaerobic stabilizer in the at least one reactive diluent; and (2) degassing the composition of (1) to remove dissolved oxygen.

The present disclosure provides a method of preparing a nanostructure composition, the method comprising:

(a) providing a composition comprising at least one population of nanostructures, at least one solvent, at least one reactive diluent, and at least one anaerobic stabilizer; and
(b) removing the at least one solvent in the composition of (a).

The present disclosure provides a method of preparing a nanostructure composition, the method comprising:

(a) providing a composition comprising at least one population of nanostructures and at least one solvent;
(b) admixing at least one reactive diluent and at least one anaerobic stabilizer with the composition of (a);
(c) removing the at least one solvent in the composition of (b); and
(d) admixing at least one organic resin with the composition of (c).

In some embodiments, wherein the admixing in (b) further comprises:

(1) dissolving the at least one anaerobic stabilizer in the at least one reactive diluent; and (2) degassing the composition of (1) to remove dissolved oxygen.

The present disclosure provides a method of preparing a nanostructure composition, the method comprising:

(a) providing a composition comprising at least one population of nanostructures, at least one solvent, at least one reactive diluent, and at least one anaerobic stabilizer;
(b) removing the at least one solvent in the composition of (a); and
(c) admixing at least one organic resin with the composition of (b).

The anaerobic stabilizer provides increased stability to the nanostructure composition and allows for storage of the nanostructure composition for extended periods of time. In some embodiments, the population of nanostructures can be stored with an anaerobic stabilizer for between 1 minute and 3 years, between 1 minute and 12 months, between 1 minute and 6 months, between 1 minute and 3 months, between 1 minute and 1 month, between 1 minute and 15 days, between 1 minute and 1 day, between 1 day and 3 years, between 1 day and 12 months, between 1 day and 6 months, between 1 day and 3 months, between 1 day and 1 month, between 1 day and 15 days, between 15 days and 3 years, between 15 days and 12 months, between 15 days and 6 months, between 15 days and 3 months, between 15 days and 1 month, between 1 month and 3 years, between 1 month and 12 months, between 1 month and 6 months, between 1 month and 3 months, between 3 months and 3 years, between 3 months and 12 months, between 3 months and 6 months, between 6 months and 3 years, between 6 months and 12 months, or between 12 months and 3 years.

In some embodiments, the at least one anaerobic stabilizer is dissolved in the at least one reactive diluent for a time between about 1 minute and about 24 hours, about 1 minute and about 20 hours, about 1 minute and about 15 hours, about 1 minute and about 10 hours, about 1 minute and about 5 hours, about 1 minute and about 1 hour, about 1 minute and about 30 minutes, about 1 minute and about 10 minutes, about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

In some embodiments, the at least one anaerobic stabilizer is dissolved in the at least one reactive diluent at a temperature of between about 10° C. and about 90° C., about 10° C. and about 80° C., about 10° C. and about 70° C., about 10° C. and about 60° C., about 10° C. and about 50° C., about 10° C. and about 40° C., about 10° C. and about 25° C., about 10° C. and about 20° C., about 20° C. and about 90° C., about 20° C. and about 80° C., about 20° C. and about 70° C., about 20° C. and about 60° C., about 20° C. and about 50° C., about 20° C. and about 40° C., about 20° C. and about 25° C., about 25° C. and about 90° C., about 25° C. and about 80° C., about 25° C. and about 70° C., about 25° C. and about 60° C., about 25° C. and about 50° C., about 25° C. and about 40° C., about 40° C. and about 90° C., about 40° C. and about 80° C., about 40° C. and about 70° C., about 40° C. and about 60° C., about 40° C. and about 50° C., about 50° C. and about 90° C., about 50° C. and about 80° C., about 50° C. and about 70° C., about 50° C. and about 60° C., about 60° C. and about 90° C., about 60° C. and about 80° C., about 60° C. and about 70° C., about 70° C. and about 90° C., about 70° C. and about 80° C., or about 80° C. and about 90° C.

In some embodiments, the composition with the at least one anaerobic stabilizer dissolved in the at least one reactive diluent is degassed to remove dissolved oxygen. In some embodiments, the degassing is by pulling a vacuum for a period of time. In some embodiments, the degassing is for a time between about 10 minutes and about 48 hours, about 10 minutes and about 40 hours, about 10 minutes and about 30 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 48 hours, about 30 minutes and about 40 hours, about 30 minutes and about 30 hours, about 30 minutes and about 20 hours, about 30 minutes and about 15 hours, about 30 minutes and about 10 hours, about 30 minutes and about 5 hours, about 30 minutes and about 1 hour, about 1 hour and about 48 hours, about 1 hour and about 40 hours, about 1 hour and about 30 hours, about 1 hour and about 20 hours, about 1 hour and about 15 hours, about 1 hour and about 10 hours, about 1 hour and about 5 hours, about 5 hours and about 48 hours, about 5 hours and about 40 hours, about 5 hours and about 30 hours, about 5 hours and about 20 hours, about 5 hours and about 15 hours, about 5 hours and about 10 hours, about 10 hours and about 48 hours, about 10 hours and about 40 hours, about 10 hours and about 30 hours, about 10 hours and about 20 hours, about 10 hours and about 15 hours, about 15 hours and about 48 hours, about 15 hours and about 40 hours, about 15 hours and about 30 hours, about 15 hours and about 20 hours, about 20 hours and about 48 hours, about 20 hours and about 40 hours, about 20 hours and about 30 hours, about 30 hours and about 48 hours, about 30 hours and about 40 hours, or about 40 hours and about 48 hours.

In some embodiments, the degassing is by pulling a vacuum down to between about 1 mtorr and about 500 mtorr, about 1 mtorr and about 250 mtorr, about 1 mtorr and about 150 mtorr, about 1 mtorr and about 100 mtorr, about 1 mtorr and about 50 mtorr, about 1 mtorr and about 25 mtorr, about 1 mtorr and about 10 mtorr, about 1 mtorr and about 5 mtorr, about 5 mtorr and about 500 mtorr, about 5 mtorr and about 250 mtorr, about 5 mtorr and about 150 mtorr, about 5 mtorr and about 100 mtorr, about 5 mtorr and about 50 mtorr, about 5 mtorr and about 25 mtorr, about 5 mtorr and about 10 mtorr, about 10 mtorr and about 500 mtorr, about 10 mtorr and about 250 mtorr, about 10 mtorr and about 150 mtorr, about 10 mtorr and about 100 mtorr, about 10 mtorr and about 50 mtorr, about 10 mtorr and about 25 mtorr, about 25 mtorr and about 500 mtorr, about 25 mtorr and about 250 mtorr, about 25 mtorr and about 150 mtorr, about 25 mtorr and about 100 mtorr, about 25 mtorr and about 50 mtorr, about 50 mtorr and about 500 mtorr, about 50 mtorr and about 250 mtorr, about 50 mtorr and about 150 mtorr, about 50 mtorr and about 100 mtorr, about 100 mtorr and about 500 mtorr, about 100 mtorr and about 250 mtorr, about 100 mtorr and about 150 mtorr, about 150 mtorr and about 500 mtorr, about 150 mtorr and about 250 mtorr, or about 250 mtorr and about 500 mtorr.

In some embodiments, the degassing is at a temperature of between about 10° C. and about 90° C., about 10° C. and about 80° C., about 10° C. and about 70° C., about 10° C. and about 60° C., about 10° C. and about 50° C., about 10° C. and about 40° C., about 10° C. and about 25° C., about 10° C. and about 20° C., about 20° C. and about 90° C., about 20° C. and about 80° C., about 20° C. and about 70° C., about 20° C. and about 60° C., about 20° C. and about 50° C., about 20° C. and about 40° C., about 20° C. and about 25° C., about 25° C. and about 90° C., about 25° C. and about 80° C., about 25° C. and about 70° C., about 25° C. and about 60° C., about 25° C. and about 50° C., about 25° C. and about 40° C., about 40° C. and about 90° C., about 40° C. and about 80° C., about 40° C. and about 70° C., about 40° C. and about 60° C., about 40° C. and about 50° C., about 50° C. and about 90° C., about 50° C. and about 80° C., about 50° C. and about 70° C., about 50° C. and about 60° C., about 60° C. and about 90° C., about 60° C. and about 80° C., about 60° C. and about 70° C., about 70° C. and about 90° C., about 70° C. and about 80° C., or about 80° C. and about 90° C.

In some embodiments, the composition comprising at least one population of nanostructures and at least one solvent is mixed with the composition comprising at least one reactive diluent and at least one anaerobic stabilizer at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10,000 rpm, or about 5,000 rpm and about 10,000 rpm.

In some embodiments, the composition comprising at least one population of nanostructures and at least one solvent is mixed with the composition comprising at least one reactive diluent and at least one anaerobic stabilizer for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

In some embodiments, the at least one solvent is removed from the nanostructure composition. In some embodiments, the removing of the at least one solvent is under vacuum for a time between about 10 minutes and about 48 hours, about 10 minutes and about 40 hours, about 10 minutes and about 30 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 48 hours, about 30 minutes and about 40 hours, about 30 minutes and about 30 hours, about 30 minutes and about 20 hours, about 30 minutes and about 15 hours, about 30 minutes and about 10 hours, about 30 minutes and about 5 hours, about 30 minutes and about 1 hour, about 1 hour and about 48 hours, about 1 hour and about 40 hours, about 1 hour and about 30 hours, about 1 hour and about 20 hours, about 1 hour and about 15 hours, about 1 hour and about 10 hours, about 1 hour and about 5 hours, about 5 hours and about 48 hours, about 5 hours and about 40 hours, about 5 hours and about 30 hours, about 5 hours and about 20 hours, about 5 hours and about 15 hours, about 5 hours and about 10 hours, about 10 hours and about 48 hours, about 10 hours and about 40 hours, about 10 hours and about 30 hours, about 10 hours and about 20 hours, about 10 hours and about 15 hours, about 15 hours and about 48 hours, about 15 hours and about 40 hours, about 15 hours and about 30 hours, about 15 hours and about 20 hours, about 20 hours and about 48 hours, about 20 hours and about 40 hours, about 20 hours and about 30 hours, about 30 hours and about 48 hours, about 30 hours and about 40 hours, or about 40 hours and about 48 hours.

In some embodiments, the removing of the at least one solvent is at a temperature of between about 10° C. and about 90° C., about 10° C. and about 80° C., about 10° C. and about 70° C., about 10° C. and about 60° C., about 10° C. and about 50° C., about 10° C. and about 40° C., about 10° C. and about 25° C., about 10° C. and about 20° C., about 20° C. and about 90° C., about 20° C. and about 80° C., about 20° C. and about 70° C., about 20° C. and about 60° C., about 20° C. and about 50° C., about 20° C. and about 40° C., about 20° C. and about 25° C., about 25° C. and about 90° C., about 25° C. and about 80° C., about 25° C. and about 70° C., about 25° C. and about 60° C., about 25° C. and about 50° C., about 25° C. and about 40° C., about 40° C. and about 90° C., about 40° C. and about 80° C., about 40° C. and about 70° C., about 40° C. and about 60° C., about 40° C. and about 50° C., about 50° C. and about 90° C., about 50° C. and about 80° C., about 50° C. and about 70° C., about 50° C. and about 60° C., about 60° C. and about 90° C., about 60° C. and about 80° C., about 60° C. and about 70° C., about 70° C. and about 90° C., about 70° C. and about 80° C., or about 80° C. and about 90° C.

In some embodiments, the removing of the at least one solvent is by pulling a vacuum down to between about 1 mtorr and about 1000 mtorr, about 1 mtorr and about 750 mtorr, 1 mtorr and about 500 mtorr, about 1 mtorr and about 250 mtorr, about 1 mtorr and about 150 mtorr, about 1 mtorr and about 100 mtorr, about 1 mtorr and about 50 mtorr, about 1 mtorr and about 25 mtorr, about 1 mtorr and about 10 mtorr, about 1 mtorr and about 5 mtorr, about 5 mtorr and about 1000 mtorr, about 5 mtorr and about 750 mtorr about 5 mtorr and about 500 mtorr, about 5 mtorr and about 250 mtorr, about 5 mtorr and about 150 mtorr, about 5 mtorr and about 100 mtorr, about 5 mtorr and about 50 mtorr, about 5 mtorr and about 25 mtorr, about 5 mtorr and about 10 mtorr, about 10 mtorr and about 1000 mtorr, about 10 mtorr and about 750 mtorr, about 10 mtorr and about 500 mtorr, about 10 mtorr and about 250 mtorr, about 10 mtorr and about 150 mtorr, about 10 mtorr and about 100 mtorr, about 10 mtorr and about 50 mtorr, about 10 mtorr and about 25 mtorr, about 25 mtorr and about 1000 mtorr, about 25 mtorr and about 750 mtorr, about 25 mtorr and about 500 mtorr, about 25 mtorr and about 250 mtorr, about 25 mtorr and about 150 mtorr, about 25 mtorr and about 100 mtorr, about 25 mtorr and about 50 mtorr, about 50 mtorr and about 1000 mtorr, about 50 mtorr and about 750 mtorr, about 50 mtorr and about 500 mtorr, about 50 mtorr and about 250 mtorr, about 50 mtorr and about 150 mtorr, about 50 mtorr and about 100 mtorr, about 100 mtorr and about 1000 mtorr, about 100 mtorr and about 750 mtorr, about 100 mtorr and about 500 mtorr, about 100 mtorr and about 250 mtorr, about 100 mtorr and about 150 mtorr, about 150 mtorr and about 1000 mtorr, about 150 mtorr and about 750 mtorr, about 150 mtorr and about 500 mtorr, about 150 mtorr and about 250 mtorr, about 250 mtorr and about 1000 mtorr, about 250 mtorr and about 750 mtorr, about 250 mtorr and about 500 mtorr, about 500 mtorr and about 1000 mtorr, about 500 mtorr and about 750 mtorr, or about 750 mtorr and about 1000 mtorr.

In some embodiments, if more than one population of nanostructures is used, the at least one first population of nanostructures stored in at least one first reactive diluent and at least one first anaerobic stabilizer is added to at least one second population of nanostructures stored in at least one second reactive diluent and at least one second anaerobic stabilizer. In some embodiments, the first and second reactive diluents are the same. In some embodiments, the first and second reactive diluents are different. In some embodiments, the first and second anaerobic stabilizers are the same. In some embodiments, the first and second anaerobic stabilizers are different.

In some embodiments, a first population of nanostructures in at least one first reactive diluent and at least one first anaerobic stabilizer is mixed with a second population of nanostructures in at least one second reactive diluent and at least one second anaerobic stabilizer at an agitation rate of between 100 rpm and 10,000 rpm, between 100 rpm and 5,000 rpm, between 100 rpm and 3,000 rpm, between 100 rpm and 1,000 rpm, between 100 rpm and 500 rpm, between 500 rpm and 10,000 rpm, between 500 rpm and 5,000 rpm, between 500 rpm and 3,000 rpm, between 500 rpm and 1,000 rpm, between 1,000 rpm and 10,000 rpm, between 1,000 rpm and 5,000 rpm, between 1,000 rpm and 3,000 rpm, between 3,000 rpm and 10,000 rpm, between 3,000 rpm and 10,000 rpm, and between 5,000 rpm and 10,000 rpm.

In some embodiments, a first population of nanostructures in at least one first reactive diluent and at least one first anaerobic stabilizer is mixed with a second population of nanostructures in at least one second reactive diluent and at least one second anaerobic stabilizer for a time of between 10 minutes and 24 hours, between 10 minutes and 20 hours, between 10 minutes and 15 hours, between 10 minutes and 10 hours, between 10 minutes and 5 hours, between 10 minutes and 1 hour, between 10 minutes and 30 minutes, between 30 minutes and 24 hours, between 30 minutes and 20 hours, between 30 minutes and 15 hours, between 30 minutes and 10 hours, between 30 minutes and 5 hours, between 30 minutes and 1 hour, between 1 hour and 24 hours, between 1 hour and 20 hours, between 1 hour and 15 hours, between 1 hour and 10 hours, between 1 hour and 5 hours, between 5 hours and 24 hours, between 5 hours and 20 hours, between 5 hours and 15 hours, between 5 hours and 10 hours, between 10 hours and 24 hours, between 10 hours and 20 hours, between 10 hours and 15 hours, between 15 hours and 24 hours, between 15 hours and 20 hours, or between 20 hours and 24 hours.

In some embodiments, provided is a composition comprising at least one population of nanostructures, at least one reactive diluent, and at least one anaerobic stabilizer, can be stably stored for between about 1 minute and about 3 years, about 1 minute and about 12 months, about 1 minute and about 6 months, about 1 minute and about 3 months, about 1 minute and about 1 month, about 1 minute and about 15 days, about 1 minute and about 1 day, about 1 day and about 3 years, about 1 day and about 12 months, about 1 day and about 6 months, about 1 day and about 3 months, about 1 day and about 1 month, about 1 day and about 15 days, about 15 days and about 3 years, about 15 days and about 12 months, about 15 days and about 6 months, about 15 days and about 3 months, about 15 days and about 1 month, about 1 month and about 3 years, about 1 month and about 12 months, about 1 month and about 6 months, about 1 month and about 3 months, about 3 months and about 3 years, about 3 months and about 12 months, about 3 months and about 6 months, about 6 months and about 3 years, about 6 months and about 12 months, or about 12 months and about 3 years.

In some embodiments, if more than one organic resin is used, the organic resins are added together and mixed. In some embodiments, a first organic resin is mixed with a second organic resin at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10,000 rpm, or about 5,000 rpm and about 10,000 rpm.

In some embodiments, a first organic resin is mixed with a second organic resin for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

In some embodiments, provided is a composition comprising at least one population of nanostructures, at least one reactive diluent, and at least one anaerobic stabilizer, is mixed with at least one organic resin at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10,000 rpm, or about 5,000 rpm and about 10,000 rpm.

In some embodiments, provided is a composition comprising at least one population of nanostructures, at least one reactive diluent, and at least one anaerobic stabilizer, is mixed with at least one organic resin for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

In some embodiments, at least one population of nanostructures, at least one reactive diluent, at least one anaerobic stabilizer and at least one organic resin are mixed. In some embodiments, the organic resin does not react with the reactive diluent and the mixture can be stored for extended lengths of time.

In some embodiments, the composition comprising at least one population of nanostructures, at least one reactive diluent, at least one anaerobic stabilizer and at least one organic resin can be stably stored for between about 1 minute and about 3 years, about 1 minute and about 12 months, about 1 minute and about 6 months, about 1 minute and about 3 months, about 1 minute and about 1 month, about 1 minute and about 15 days, about 1 minute and about 1 day, about 1 day and about 3 years, about 1 day and about 12 months, about 1 day and about 6 months, about 1 day and about 3 months, about 1 day and about 1 month, about 1 day and about 15 days, about 15 days and about 3 years, about 15 days and about 12 months, about 15 days and about 6 months, about 15 days and about 3 months, about 15 days and about 1 month, about 1 month and about 3 years, about 1 month and about 12 months, about 1 month and about 6 months, about 1 month and about 3 months, about 3 months and about 3 years, about 3 months and about 12 months, about 3 months and about 6 months, about 6 months and about 3 years, about 6 months and about 12 months, or about 12 months and about 3 years.

The present disclosure also provides a method of making a nanostructure composition comprising admixing at least one population of nanostructures, at least one non-reactive diluent, at least one anaerobic stabilizer, and at least one organic resin.

The present disclosure further provides a method of preparing a nanostructure composition, the method comprising:

(a) providing a composition comprising at least one population of nanostructures, at least one solvent, at least one non-reactive diluent, and at least one anaerobic stabilizer;

(b) removing the at least one solvent in the composition of (a); and (c) admixing at least one organic resin with the composition of (b).

In some embodiments, the composition comprising at least one population of nanostructures, at least one non-reactive diluent, at least one anaerobic stabilizer, and at least one organic resin can be stably stored for between about 1 minute and about 3 years, about 1 minute and about 12 months, about 1 minute and about 6 months, about 1 minute and about 3 months, about 1 minute and about 1 month, about 1 minute and about 15 days, about 1 minute and about 1 day, about 1 day and about 3 years, about 1 day and about 12 months, about 1 day and about 6 months, about 1 day and about 3 months, about 1 day and about 1 month, about 1 day and about 15 days, about 15 days and about 3 years, about 15 days and about 12 months, about 15 days and about 6 months, about 15 days and about 3 months, about 15 days and about 1 month, about 1 month and about 3 years, about 1 month and about 12 months, about 1 month and about 6 months, about 1 month and about 3 months, about 3 months and about 3 years, about 3 months and about 12 months, about 3 months and about 6 months, about 6 months and about 3 years, about 6 months and about 12 months, or about 12 months and about 3 years.

In some embodiments, a thermal initiator or a photoinitiator can be added to the nanostructure composition to facilitate curing.

Making a Nanostructure Layer

The nanostructures used in the present disclosure can be embedded in a polymeric matrix using any suitable method. As used herein, the term "embedded" is used to indicate that the nanostructure population is enclosed or encased with the polymer that makes up the majority of the component of the matrix. The some embodiments, the at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

The nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. Preferably, the nanostructure composition is cured after deposition. Suitable curing methods include photo-curing, such as UV curing, and thermal curing. Traditional laminate film processing methods, tape-coating methods, and/or roll-to-roll fabrication methods can be employed in forming the nanostructure films of the present disclosure. The nanostructure composition can be coated directly onto the desired layer of a substrate. Alternatively, the nanostructure composition can be formed into a solid layer as an independent element and subsequently applied to the substrate. In some embodiments, the nanostructure composition can be deposited on one or more barrier layers.

Spin Coating

In some embodiments, the nanostructure composition is deposited onto a substrate using spin coating. In spin coating a small amount of material is typically deposited onto the center of a substrate loaded a machine called the spinner which is secured by a vacuum. A high speed of rotation is applied on the substrate through the spinner which causes centripetal force to spread the material from the center to the edge of the substrate. While most of the material would be spun off, a certain amount remains of the substrate, forming a thin film of material on the surface as the rotation continues. The final thickness of the film is determined by the nature of the deposited material and the substrate in addition to the parameters chosen for the spin process such as spin speed, acceleration, and spin time. For typical films, a spin speed of 1500 to 6000 rpm is used with a spin time of 10-60 seconds.

Mist Deposition

In some embodiments, the nanostructure composition is deposited onto a substrate using mist deposition. Mist deposition takes place at room temperature and atmospheric pressure and allows precise control over film thickness by changing the process conditions. During mist deposition, a liquid source material is turned into a very fine mist and carried to the deposition chamber by nitrogen gas. The mist is then drawn to a surface by a high voltage potential between the field screen and the holder. Once the droplets coalesce on the surface, the surface is removed from the chamber and thermally cured to allow the solvent to evaporate. The liquid precursor is a mixture of solvent and material to be deposited. It is carried to the atomizer by pressurized nitrogen gas. Price, S. C., et al., "Formation of Ultra-Thin Quantum Dot Films by Mist Deposition," *ESC Transactions* 11:89-94 (2007).

Spray Coating

In some embodiments, the nanostructure composition is deposited onto a substrate using spray coating. The typical equipment for spray coating comprises a spray nozzle, an atomizer, a precursor solution, and a carrier gas. In the spray deposition process, a precursor solution is pulverized into micro sized drops by means of a carrier gas or by atomization (e.g., ultrasonic, air blast, or electrostatic). The droplets that come out of the atomizer are accelerated by the substrate surface through the nozzle by help of the carrier gas which is controlled and regulated as desired. Relative motion between the spray nozzle and the substrate is defined by design for the purpose of full coverage on the substrate.

In some embodiments, application of the nanostructure composition further comprises a solvent. In some embodiments, the solvent for application of the nanostructure composition is water, organic solvents, inorganic solvents, halogenated organic solvents, or mixtures thereof. Illustrative solvents include, but are not limited to, water, $D_2O$, acetone, ethanol, dioxane, ethyl acetate, methyl ethyl ketone, isopropanol, anisole, γ-butyrolactone, dimethylformamide, N-methylpyrroldinone, dimethylacetamide, hexamethylphosphoramide, toluene, dimethylsulfoxide, cyclopentanone, tetramethylene sulfoxide, xylene, ε-caprolactone, tetrahydrofuran, tetrachloroethylene, chloroform, chlorobenzene, dichloromethane, 1,2-dichloroethane, 1,1,2,2-tetrachloroethane, or mixtures thereof.

In some embodiments, the compositions are thermally cured to form the nanostructure layer. In some embodiments, the compositions are cured using UV light. In some embodiments, the nanostructure composition is coated directly onto a barrier layer of a nanostructure film, and an additional barrier layer is subsequently deposited upon the nanostructure layer to create the nanostructure film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a nanostructure layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum film white point), as well as the nanostructure film thickness and other characteristics. Additionally, these embodiments will allow for periodic testing of the nanostructure film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Barrier Layers

In some embodiments, the nanostructure molded article comprises one or more barrier layers disposed on either one or both sides of the nanostructure layer. Suitable barrier layers protect the nanostructure layer and the nanostructure molded article from environmental conditions such as high temperatures, oxygen, and moisture. Suitable barrier materials include non-yellowing, transparent optical materials which are hydrophobic, chemically and mechanically compatible with the nanostructure molded article, exhibit photo- and chemical-stability, and can withstand high temperatures. In some embodiments, the one or more barrier layers have a similar refractive index to the nanostructure molded article. In some embodiments, the matrix material of the nanostructure molded article and the one or more adjacent barrier layers have similar refractive indices, such that most of the light transmitting through the barrier layer toward the nanostructure molded article is transmitted from the barrier layer into the nanostructure layer. Using materials with similar refractive indexes reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In preferred embodiments, the one or more barrier layers will be compatible with laminate film processing techniques, whereby the nanostructure layer is disposed on at least a first barrier layer, and at least a second barrier layer is disposed on the nanostructure layer on a side opposite the nanostructure layer to form the nanostructure molded article according to one embodiment of the present disclosure. Suitable barrier materials include any suitable barrier materials known in the art. For example, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the nanostructure molded article comprises at least 2 layers comprising different materials or compositions, such that the multi-layered barrier eliminates or reduces pinhole defect alignment in the barrier layer, providing an effective barrier to oxygen and moisture penetration into the nanostructure layer. The nanostructure layer can include any suitable material or combination of materials and any suitable number of barrier layers on either or both sides of the nanostructure layer. The materials, thickness, and number of barrier layers will depend on the particular application, and will suitably be chosen to maximize barrier protection and brightness of the nanostructure layer while minimizing thickness of the nanostructure molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the nanostructures comprise heavy metals or other toxic materials, which guidelines may require more or thicker barrier layers. Additional considerations for the barriers include cost, availability, and mechanical strength.

In some embodiments, the nanostructure film comprises two or more barrier layers adjacent each side of the nanostructure layer, for example, two or three layers on each side or two barrier layers on each side of the nanostructure layer. In some embodiments, each barrier layer comprises a thin glass sheet, e.g., glass sheets having a thickness of about 100 μm, 100 μm or less, 50 μm or less, preferably 50 μm or about 50 μm.

Each barrier layer of the nanostructure film of the present disclosure can have any suitable thickness, which will depend on the particular requirements and characteristics of the lighting device and application, as well as the individual film components such as the barrier layers and the nanostructure layer, as will be understood by persons of ordinary skill in the art. In some embodiments, each barrier layer can have a thickness of 50 μm or less, 40 μm or less, 30 μm or less, 25 μm or less, 20 μm or less, or 15 μm or less. In certain embodiments, the barrier layer comprises an oxide coating, which can comprise materials such as silicon oxide, titanium oxide, and aluminum oxide (e.g., $SiO_2$, $Si_2O_3$, $TiO_2$, or $Al_2O_3$). The oxide coating can have a thickness of about 10 μm or less, 5 μm or less, 1 μm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Nanostructure Film Features and Embodiments

In some embodiments, the nanostructure films are used to form display devices. As used herein, a display device refers to any system with a lighting display. Such devices include, but are not limited to, devices encompassing a liquid crystal display (LCD), televisions, computers, mobile phones, smart phones, personal digital assistants (PDAs), gaming devices, electronic reading devices, digital cameras, and the like.

In some embodiments, the optical films containing nanostructure compositions are substantially free of cadmium. As used herein, the term "substantially free of cadmium" is intended that the nanostructure compositions contain less than 100 ppm by weight of cadmium. The RoHS compliance definition requires that there must be no more than 0.01% (100 ppm) by weight of cadmium in the raw homogeneous precursor materials. The cadmium concentration can be measured by inductively coupled plasma mass spectroscopy (ICP-MS) analysis, and are on the parts per billion (ppb) level. In some embodiments, optical films that are "substantially free of cadmium" contain 10 to 90 ppm cadmium. In other embodiment, optical films that are substantially free of cadmium contain less than about 50 ppm, less than about 20 ppm, less than about 10 ppm, or less than about 1 ppm of cadmium.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

Preparation of a Green Quantum Dot Concentrate and a Red Quantum Dot Concentrate 4-Hydroxy-TEMPO (200 ppm) was first dissolved in isobornyl acrylate (10 g) at 45° C. in atmosphere for 3 hours. The isobornyl acrylate with 200 ppm 4-hydroxy-TEMPO was then degassed by pulling a vacuum overnight down to 50 mtorr.

To achieve a green quantum dot concentrate with an optical density of 30~50 (measured at 460 nm in a 1 cm path length cuvette), the isobornyl acrylate with 200 ppm 4-hydroxy-TEMPO (10 mL) was added to a toluene (10 mL) solution of green quantum dots (about 150 mg of green quantum dot/mL) with an optical density of about 40 (measured at 460 nm in a 1 cm path length cuvette). The mixture was mixed in a planetary vacuum mixer at 2000 rpm for 2 minutes. Toluene was removed from the mixture by pulling a vacuum down to 50 mtorr at 50° C. for 12 hours. The resulting green quantum dot concentrate had an optical density of 35 (measured at 460 nm in a 1 cm path length cuvette).

To achieve a red quantum dot concentrate with an optical density of 30~50 (measured at 460 nm in a 1 cm path length cuvette), the isobornyl acrylate with 200 ppm 4-hydroxy-TEMPO (10 mL) was added to a toluene (10 mL) solution of red quantum dots (about 50~100 mg of red quantum dot/mL). The mixture was mixed in a planetary vacuum mixer at 2000 rpm for 2 minutes. Toluene was removed from the mixture by pulling a vacuum down to 50 mtorr at 50° C. for 12 hours. The resulting red quantum dot concentrate had an optical density of 45 (measured at 460 nm in a 1 cm path length cuvette).

Example 2

Preparation of Homogenous Quantum Dot Concentrates-Resin Premix

Materials:

Green quantum dot concentrate (optical density: 30~35) in isobornyl acrylate with 200 ppm 4-hydroxy-TEMPO Red quantum dot concentrate (optional density: 30~50) in isobornyl acrylate with 200 ppm 4-hydroxy-TEMPO 2,4,6-Trimethylbenzoylphenyl phosphinate (TPO-L): 316.33 g/mol Pentaerythritol tetrakis (3-mercaptopropionate) (PTMP): 488.66 g/mol Tricyclodecane dimethanol diacrylate (TCDD): 304.38 g/mol $TiO_2$ (R706)

ZnS (Sactolith)

Silicone polymer beads (Tospearl-120)

Equipment:

Planetary vacuum mixer

To a disposable mixing cup was added 12 g of PTMP, 43.2 of TCDD, 2.146 g green quantum dot concentrate, 1.037 g red quantum dot concentrate, and 0.15 g of TPO-L. The mixture was mixed in a planetary vacuum mixer at 2000 rpm for 1 minutes. 0.45 g $TiO_2$ was added followed by mixing in a planetary vacuum mixer at 2000 rpm for 5 minutes. The resulting quantum dot concentrates-resin premix has an optical density of 1-3 (measured at 460 nm in a 1 cm path length cuvette).

Example 3

Shelf Stability Under Anaerobic Condition for Quantum Dot Concentrates with and without 4-Hydroxy-TEMPO Samples:

Sample A: Green quantum dot concentrate (Dark 45° C.) in isobornyl acrylate with 200 ppm 4-hydroxy-TEMPO Sample B: Red quantum dot concentrate (Dark 45° C.) in isobornyl acrylate with 200 ppm 4-hydroxy-TEMPO Sample C: Green quantum dot concentrate (Visible light) in isobornyl acrylate with 200 ppm 4-hydroxy-TEMPO Sample D: Red quantum dot concentrate (Visible light) in isobornyl acrylate with 200 ppm 4-hydroxy-TEMPO Sample E: Green quantum dot concentrate in isobornyl acrylate without 4-hydroxy-TEMPO Sample F: Red quantum dot concentrate in isobornyl acrylate without 4-hydroxy-TEMPO Sample G: Isobornyl acrylate control without 4-hydroxy-TEMPO To evaluate the effect of an anaerobic stabilizer (e.g., 4-hydroxy-TEMPO) for quantum dot concentrates, samples A-D, quantum dot concentrates in isobornyl acrylate with 200 ppm 4-hydroxy-TEMPO were prepared according to the methods described above in Example 1. Samples E and F, quantum dot concentrates in isobornyl acrylate without 4-hydroxy-TEMPO, were also prepared according to the methods described above in Example 1 without adding 4-hydroxy-TEMPO to isobornyl acrylate. Sample G, isobornyl acrylate without 4-hydroxy-TEMPO, was used as a control.

All samples were maintained under anaerobic conditions (with less than 10 ppm dissolved oxygen) at 50° C. A small amount of each sample was withdrew for viscosity measurement by cone and plate Brookfield viscometer initially, after 12 hrs, and after 24 hrs, respectively.

FIG. 1 illustrates viscosity versus storage time for samples A-G. As shown by FIG. 1, viscosity values remain relatively stable during the 24 hr period for each of samples A-D, with quantum dot concentrates in isobornyl acrylate with 200 ppm 4-hydroxy-TEMPO. By contrast, viscosity values increase notably for samples E and F, with quantum dot concentrates in isobornyl acrylate without 4-hydroxy-TEMPO.

While various embodiments of the present disclosure have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present disclosure should not be limited by any of the above-described exemplary embodiments, but should be defined only in accordance with the following claims and their equivalents.

As will be understood by persons of ordinary skill in the art, any of the foregoing device and/or processing components can be used in any suitable combination to form the QD film of the present disclosure.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A method of preparing a nanostructure composition, the method comprising:

(a) providing a composition comprising at least one population of nanostructures and at least one solvent, wherein the at least one population of nanostructures contains a core selected from the group consisting of InP, InZnP, InGaP, CdSe, CdS, CdSSe, CdZnSe, CdZnS, ZnSe, ZnSSe, InAs, InGaAs, and InAsP;

(b) admixing at least one reactive diluent and at least one anaerobic stabilizer with the composition of (a), wherein the at least one anaerobic stabilizer is a nitroxide-containing compound or a nitroso-containing compound;

(c) removing the at least one solvent in the composition of (b); and (d) admixing at least one organic resin with the composition of (c), wherein the at least one organic resin is a mercapto-functional compound, and wherein the weight percentage of the reactive diluent in the nanostructure composition is between about 50% and about 99%.

2. The method of claim 1, wherein the at least one reactive diluent is isobornyl acrylate.

3. The method of claim 1, wherein the at least one anaerobic stabilizer comprises a

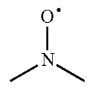

group.

4. The method of claim 1, wherein the nanostructure composition comprises two populations of nanostructures, one reactive diluent, and one anaerobic stabilizer.

5. The method of claim 1, wherein the at least one anaerobic stabilizer is 4-hydroxy-2,2,6,6-tetramethylpiperidin-1-oxyl (4-hydroxy-TEMPO).

6. The method of claim 1, wherein the at least one reactive diluent is isobornyl acrylate and the at least one anaerobic stabilizer is 4-hydroxy-TEMPO.

7. The method of claim 6, wherein the nanostructure composition comprises as a weight percentage 200 ppm 4-hydroxy-TEMPO in relation to isobornyl acrylate.

8. The method of claim 1, wherein the at least one organic resin is a thermosetting resin or a UV curable resin.

9. The method of claim 1, wherein the at least one organic resin is a UV curable resin.

10. The method of claim 1, further comprising:

(e) admixing at least one thermal initiator or photoinitiator with the composition of (d).

11. The method of claim 1, wherein the nanostructures are quantum dots.

12. The method of claim 11, wherein the quantum dots are InP and/or CdSe quantum dots.

13. The method of claim 1, wherein the mercapto-functional compound is pentaerythritol tetra(3-mercapto-propionate) (PETMP); trimethylol-propane tri(3-mercaptopropionate) (TMPMP); glycol di(3-mercapto-propionate) (GDMP); tris[25-(3-mercaptopropionyloxy)ethyl]isocyanurate (TEMPIC); di-pentaerythritol hexa(3-mercapto-propionate) (Di-PETMP); ethoxylated trimethylolpropane tri(3-mercapto-propionate); polycaprolactone tetra(3-mercapto-propionate); pentaerythritol tetramercaptoacetate (PETMA); trimethylolpropane trimercaptoacetate (TMPMA); or glycol dimercaptoacetate (GDMA).

* * * * *